US010084146B2

(12) United States Patent
Tanaka et al.

(10) Patent No.: US 10,084,146 B2
(45) Date of Patent: Sep. 25, 2018

(54) ORGANIC ELECTROLUMINESCENT ELEMENT AND LIGHTING DEVICE

(71) Applicant: LUMIOTEC INC., Yonezawa-shi, Yamagata (JP)

(72) Inventors: Junichi Tanaka, Yonezawa (JP); Mitsuru Morimoto, Yonezawa (JP)

(73) Assignee: LUMIOTEC INC., Yonezawa-shi (JP)

( * ) Notice: Subject to any disclaimer, the term of this patent is extended or adjusted under 35 U.S.C. 154(b) by 0 days.

(21) Appl. No.: 15/554,528

(22) PCT Filed: Feb. 29, 2016

(86) PCT No.: PCT/JP2016/056025
§ 371 (c)(1),
(2) Date: Aug. 30, 2017

(87) PCT Pub. No.: WO2016/140180
PCT Pub. Date: Sep. 9, 2016

(65) Prior Publication Data
US 2018/0047926 A1    Feb. 15, 2018

(30) Foreign Application Priority Data

Mar. 2, 2015    (JP) .................................. 2015-040415
Oct. 26, 2015    (JP) .................................. 2015-210196

(51) Int. Cl.
*H01L 51/50*    (2006.01)
*H01L 27/32*    (2006.01)
(Continued)

(52) U.S. Cl.
CPC ...... *H01L 51/5012* (2013.01); *H01L 27/3276* (2013.01); *H01L 51/5056* (2013.01);
(Continued)

(58) Field of Classification Search
CPC .......... H01L 25/167; H01L 27/14643–27/156; H01L 27/3227; H01L 31/02024; H01L 31/0203; H01L 31/1032; H01L 31/107
See application file for complete search history.

(56) References Cited

U.S. PATENT DOCUMENTS 4,539,507 A    9/1985    VanSlyke et al.
4,769,292 A    9/1988    Tang et al.
(Continued)

FOREIGN PATENT DOCUMENTS

EP    0281381 A2    9/1988
EP    2 503 617 A2    9/2012
(Continued)

OTHER PUBLICATIONS

International Search Report and Written Opinion of the International Searching Authority (Forms PCT/ISA/237 and PCT/ISA/210), dated May 17, 2016, for International Application No. PCT/JP2016/056025, with an English translation.
(Continued)

*Primary Examiner* — Cuong B Nguyen
*Assistant Examiner* — Samuel Park
(74) *Attorney, Agent, or Firm* — Birch, Stewart, Kolasch & Birch, LLP

(57) ABSTRACT

The present invention provides an organic electroluminescent element which includes a first light emitting unit (23) that is positioned on the side of a cathode (21) and includes a first light emitting layer (28A), a second light emitting unit (24) that is adjacent to the first light emitting unit (23) with sandwiching a first charge generating layer (26A) and includes a second light emitting layer (28B), and a third light emitting unit (25) that is adjacent to the second light emitting unit (24) with sandwiching a second charge generating layer (26B) and includes a third light emitting layer (28C), and in
(Continued)

which differences of the total thickness of the first light emitting unit (23) and the total thickness of the third light emitting unit (25) with the total thickness of the second light emitting unit (24) are 30 nm to 70 nm.

20 Claims, 13 Drawing Sheets

(51) Int. Cl.
  *H01L 51/52* (2006.01)
  *H05B 33/26* (2006.01)
  *H01L 51/00* (2006.01)

(52) U.S. Cl.
  CPC ...... *H01L 51/5072* (2013.01); *H01L 51/5092* (2013.01); *H01L 51/5206* (2013.01); *H01L 51/5221* (2013.01); *H01L 51/5228* (2013.01); *H01L 51/5278* (2013.01); *H05B 33/26* (2013.01); *H01L 51/0084* (2013.01); *H01L 2251/53* (2013.01); *H01L 2251/5376* (2013.01); *H01L 2251/558* (2013.01)

(56) References Cited

U.S. PATENT DOCUMENTS

| | | | |
|---|---|---|---|
| 4,885,211 | A | 12/1989 | Tang et al. |
| 6,107,734 | A | 8/2000 | Tanaka et al. |
| 2003/0189401 | A1 | 10/2003 | Kido et al. |
| 2006/0008740 | A1 | 1/2006 | Kido et al. |
| 2006/0158104 | A1 | 7/2006 | Iijima et al. |
| 2006/0273714 | A1 | 12/2006 | Forrest et al. |
| 2006/0289882 | A1 | 12/2006 | Nishimura et al. |
| 2009/0261360 | A1 | 10/2009 | Yasukawa et al. |
| 2011/0057178 | A1* | 3/2011 | Shitagaki ............ H01L 51/5012 257/40 |
| 2012/0241794 | A1 | 9/2012 | Seo et al. |
| 2015/0034923 | A1 | 2/2015 | Kim et al. |
| 2015/0060812 | A1* | 3/2015 | Kim .................... H01L 51/5044 257/40 |
| 2015/0207091 | A1 | 7/2015 | Morimoto et al. |
| 2015/0340623 | A1 | 11/2015 | Kawamura et al. |
| 2016/0104749 | A1 | 4/2016 | Tsuji et al. |
| 2016/0308156 | A1* | 10/2016 | Kawata ................. H01L 51/504 |
| 2016/0329512 | A1 | 11/2016 | Nishide et al. |

FOREIGN PATENT DOCUMENTS

| | | |
|---|---|---|
| EP | 2 747 160 A2 | 6/2014 |
| EP | 2 833 407 A2 | 2/2015 |
| JP | 59-194393 A | 11/1984 |
| JP | 63-264692 A | 11/1988 |
| JP | 2-15595 A | 1/1990 |
| JP | 11-329748 A | 11/1999 |
| JP | 2003-45676 A | 2/2003 |
| JP | 2003-272860 A | 9/2003 |
| JP | 2006-24791 A | 1/2006 |
| JP | 2006-156828 A | 6/2006 |
| JP | 2006-172762 A | 6/2006 |
| JP | 2009-16184 A | 1/2009 |
| JP | 2012-212670 A | 11/2012 |
| JP | 2014-11208 A | 1/2014 |
| JP | 2015-32582 A | 2/2015 |
| WO | WO 2010/062643 A1 | 6/2010 |
| WO | WO 2013/167271 A1 | 11/2013 |
| WO | WO 2014/104315 A1 | 7/2014 |
| WO | WO 2014/157619 A1 | 10/2014 |
| WO | WO 2014/185075 A1 | 11/2014 |

OTHER PUBLICATIONS

Tang et al., "Organic electroluminescent diodes," Applied Physics Letters, vol. 51, No. 12, Sep. 21, 1987, pp. 913-915.

* cited by examiner

FIG. 10A
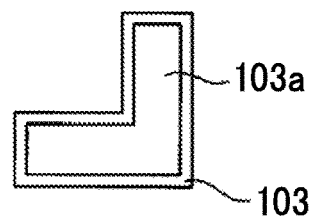
FIG. 10B
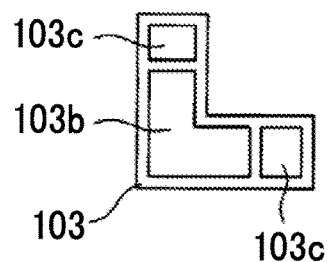
FIG. 11
| CATHODE 100nm |
| --- |
| ELECTRON TRANSPORTING LAYER Xnm |
| LIGHT EMITTING LAYER 27nm |
| HOLE TRANSPORTING LAYER 75nm |
| ANODE 100nm |

| CATHODE 100nm |
| --- |
| ELECTRON TRANSPORTING LAYER Xnm |
| LIGHT EMITTING LAYER 1 30nm |
| HOLE TRANSPORTING LAYER 45nm |
| CHARGE GENERATING LAYER 13.6 nm |
| ELECTRON TRANSPORTING LAYER 15nm |
| LIGHT EMITTING LAYER 2 25nm |
| HOLE TRANSPORTING LAYER 40nm |
| CHARGE GENERATING LAYER 13.6 nm |
| ELECTRON TRANSPORTING LAYER 5nm |
| LIGHT EMITTING LAYER 3 35nm |
| HOLE TRANSPORTING LAYER 100nm |
| ANODE 100nm |

FIG. 15

| |
|---|
| CATHODE 100nm |
| ELECTRON TRANSPORTING LAYER $T_1$nm |
| LIGHT EMITTING LAYER 1 30nm |
| HOLE TRANSPORTING LAYER 45nm |
| CHARGE GENERATING LAYER 13.6 nm |
| ELECTRON TRANSPORTING LAYER $T_2$nm |
| LIGHT EMITTING LAYER 2 25nm |
| HOLE TRANSPORTING LAYER 40nm |
| CHARGE GENERATING LAYER 13.6 nm |
| ELECTRON TRANSPORTING LAYER $T_3$nm |
| LIGHT EMITTING LAYER 3 35nm |
| HOLE TRANSPORTING LAYER 100nm |
| ANODE 100nm |

ORGANIC ELECTROLUMINESCENT ELEMENT AND LIGHTING DEVICE

TECHNICAL FIELD

The present invention relates to an organic electroluminescent element and a lighting device.

Priority is claimed on Japanese Patent Application No. 2015-040415, filed Mar. 2, 2015, and Japanese Patent Application No. 2015-210196, filed Oct. 26, 2015, the content of which is incorporated herein by reference.

BACKGROUND ART

An organic electroluminescent element (hereinafter referred to as an "organic EL element") is a self-light-emitting element including a light emitting layer made of an organic compound between a cathode and an anode which are opposite to each other. When a voltage is applied between the cathode and the anode, light is emitted due to excitons that are generated when electrons injected into the light emitting layer from the side of the cathode and holes injected into the light emitting layer from the side of the anode recombine in the light emitting layer.

It is known that, in order to increase efficiency of an organic EL element, when a structure in which organic compounds with different carrier transporting properties are laminated, electrons and holes are injected into a cathode and an anode, respectively, in a balanced manner is provided, and a layer thickness of an organic layer interposed between the cathode and the anode is set to 0.2 µm or less, sufficiently practical high luminance and high efficiency are obtained at an applied voltage of 10 V or less, 1000 cd/m$^2$, and an external quantum efficiency of 1% (for example, refer to Non Patent Literature 1).

In addition, it is described in Non Patent Literature 1 that, when the layer thickness of all organic layers interposed between the cathode and the anode is set to 1 µm or less, it is possible to provide a device that can emit light at a lower applied voltage. It is described that, when the layer thickness of the organic layer is in a range of 0.1 µm to 0.5 µm, an electric field (V/cm) useful in emitting light at an applied voltage of 25 V or less is preferably obtained (for example, refer to Patent Literatures 1 to 6).

The organic EL element has been developed based on the element structure described in Non Patent Literature 1.

In addition, as the element structure of the organic EL element, an organic EL element having a tandem structure in which a light emitting unit including at least one light emitting layer is set as one unit and a plurality of light emitting units are laminated to be connected in series between a cathode and an anode is developed (for example, refer to Patent Literatures 7 and 8).

The organic EL element having the tandem structure has been focused on as a technology through which it is possible to obtain a long lifespan, high luminance, and uniform light emission in a large area which are not possible to obtain in the structure of the organic EL element described in Non Patent Literature 1 described above in which a high current is necessary although the voltage is low.

Further, an organic EL element having a multi-photon emission (MPE) structure in which an electrically insulating charge generating layer (CGL) is arranged between a plurality of light emitting units is developed (for example, refer to Patent Literatures 9 and 10). In the organic EL element having the MPE structure, when a voltage is applied between a cathode and an anode, charges in a charge transfer complex move toward the cathode and the anode, and thus holes are injected into one light emitting unit positioned on the side of the cathode with sandwiching the charge generating layer, and electrons are injected into the other light emitting unit positioned on the side of the anode with sandwiching the charge generating layer. Accordingly, since light beams are emitted from the plurality of light emitting units at the same time at the same amperage, it is possible to obtain current efficiency and external quantum efficiency corresponding to the number of light emitting units.

The above-described organic EL element has characteristics by which it is possible to switch light emission at a high speed and it is possible to obtain a simple and thin element structure. The organic EL element is applied to a display device of, for example, a mobile phone and an in-vehicle device, utilizing such excellent characteristics. Further, in recent years, for example, a backlight of a liquid crystal display and a lighting device such as a general lighting device utilizing a thin surface light emission characteristic have been focused on.

CITATION LIST

Patent Literature

[Patent Literature 1]
Japanese Unexamined Patent Application, First Publication No. S59-194393
[Patent Literature 2]
Japanese Unexamined Patent Application, First Publication No. S63-264692
[Patent Literature 3]
Japanese Unexamined Patent Application, First Publication No. H2-15595
[Patent Literature 4]
U.S. Pat. No. 4,539,507
[Patent Literature 5]
U.S. Pat. No. 4,769,292
[Patent Literature 6]
U.S. Pat. No. 4,885,211
[Patent Literature 7]
Japanese Unexamined Patent Application, First Publication No. H11-329748
[Patent Literature 8]
Japanese Unexamined Patent Application, First Publication No. 2003-45676
[Patent Literature 9]
Japanese Unexamined Patent Application, First Publication No. 2003-272860
[Patent Literature 10]
Japanese Unexamined Patent Application, First Publication No. 2006-24791

Non Patent Literature

[Non Patent Literature 1]
Appl. Phys. Lett., 51, 913 (1987)

SUMMARY OF INVENTION

Technical Problem

Incidentally, when an organic EL element is applied to a lighting device, it is necessary to cause the organic EL element to emit light with high luminance in order to ensure sufficient illumination. However, when the organic EL element is caused to emit light with high luminance, since a light emission lifespan decreases, it is difficult to satisfy both requirements.

On the other hand, in the organic EL element having an MPE structure that is considered as a method for solving the above problems, since luminance and a driving voltage increase according to the number of light emitting units, it is difficult to increase the power efficiency (lm/W) which is important in terms of energy saving.

The present invention has been proposed in view of such circumstances in the related art and provides an organic electroluminescent element capable of emitting light with high luminance and high efficiency and supporting a long lifespan, and a lighting device including such an organic electroluminescent element.

Solution to Problem

In order to achieve the above object, the present invention provides the following solutions.

(1) An organic electroluminescent element which has a structure in which a plurality of light emitting units including at least a light emitting layer made of an organic compound are laminated between a cathode and an anode with a charge generating layer between the light emitting units and in which white light is obtained when the plurality of light emitting units emit light, the organic electroluminescent element including:

a first light emitting unit that is positioned closest to the side of the cathode among the plurality of light emitting units; and a second light emitting unit that is adjacent to the first light emitting unit with sandwiching a first charge generating layer wherein the first light emitting unit includes a first light emitting layer, a first functional layer including an electron transporting layer between the first light emitting layer and the cathode, and a second functional layer including a hole transporting layer between the first light emitting layer and the first charge generating layer, wherein the second light emitting unit includes a second light emitting layer, a third functional layer including an electron transporting layer between the second light emitting layer and the first charge generating layer, and a fourth functional layer including a hole transporting layer between the second light emitting layer and the anode, wherein the thickness of the first functional layer is 30 to 100 nm, and wherein the thickness of the third functional layer is smaller than the thickness of the first functional layer.

(2) The organic electroluminescent element according to (1), wherein the thickness of the third functional layer is 1 to 20 nm.

(3) An organic electroluminescent element which has a structure in which a plurality of light emitting units including at least a light emitting layer made of an organic compound are laminated between a cathode and an anode with a charge generating layer between the emitting units and in which white light is obtained when the plurality of light emitting units emit light, the organic electroluminescent element including:

a first light emitting unit that is positioned closest to the side of the cathode among the plurality of light emitting units;

a second light emitting unit that is adjacent to the first light emitting unit with sandwiching a first charge generating layer; and a third light emitting unit that is adjacent to the second light emitting unit with sandwiching the second charge generating layer, wherein the first light emitting unit includes a first light emitting layer, a first functional layer including an electron transporting layer between the first light emitting layer and the cathode, and a second functional layer including a hole transporting layer between the first light emitting layer and the first charge generating layer, wherein the second light emitting unit includes a second light emitting layer, a third functional layer including an electron transporting layer between the second light emitting layer and the first charge generating layer, and a fourth functional layer including a hole transporting layer between the second light emitting layer and the second charge generating layer, wherein the third light emitting unit includes a third light emitting layer, a fifth functional layer including an electron transporting layer between the third light emitting layer and the second charge generating layer, and a sixth functional layer including a hole transporting layer between the third light emitting layer and the anode, wherein the thickness of the first functional layer is 30 to 100 nm, and wherein the thickness of the third functional layer and the thickness of the fifth functional layer are smaller than the thickness of the first functional layer, (4) The organic electroluminescent element according to (3), wherein the thickness of the third functional layer and the thickness of the fifth functional layer are 1 to 20 nm.

(5) The organic electroluminescent element according to any one of (1) to (4), wherein the plurality of light emitting units include a light emitting unit including a phosphorescent light emitting layer capable of emitting light from triplet excitons, and a light emitting unit including a blue fluorescent light emitting layer capable of emitting light from singlet excitons.

(6) The organic electroluminescent element according to any one of (1) to (5), wherein light emitted from the light emitting unit including the blue fluorescent light emitting layer includes a delayed fluorescent component.

(7) The organic electroluminescent element according to (5) or (6), wherein the second light emitting unit includes the blue fluorescent light emitting layer.

(8) The organic electroluminescent element according to (3), wherein the total thickness of the second light emitting unit is smaller than both the total thickness of the first light emitting unit and the total thickness of the third light emitting unit.

(9) The organic electroluminescent element according to (8), wherein differences of the total thickness of the first light emitting unit and the total thickness of the third light emitting unit with the total thickness of the second light emitting unit are 10 to 95 nm.

(10) An organic electroluminescent element which has a structure in which a plurality of light emitting units including at least a light emitting layer made of an organic compound are laminated between a cathode and an anode with a charge generating layer between the light emitting units and in which white light is obtained when the plurality of light emitting units emit light, the organic electroluminescent element including:

a first light emitting unit that is positioned closest to the side of the cathode among the plurality of light emitting units;

a second light emitting unit that is adjacent to the first light emitting unit with sandwiching a first charge generating layer; and a third light emitting unit that is adjacent to the second light emitting unit with sandwiching a second charge generating layer, wherein the first light emitting unit includes a first light emitting layer, a first functional layer including an electron transporting layer between the first light emitting layer and the cathode, and a second functional layer including a hole transporting layer between the first light emitting layer and the first charge generating layer, wherein the second light emitting unit includes a second light emitting layer, a third functional layer including an electron transporting layer between the second light emitting layer and the first charge generating layer, and a fourth functional layer including a hole transporting layer between the second light emitting layer and the second charge generating layer, wherein the third light emitting unit includes a third light emitting layer, a fifth functional layer including an electron transporting layer between the third light emitting layer and the second charge generating layer, and a sixth functional layer including a hole transporting layer between the third light emitting layer and the anode, wherein the thickness of the third functional layer and the thickness of the fifth functional layer are smaller than the thickness of the first functional layer, wherein the first light emitting unit and the third light emitting unit include a phosphorescent light emitting layer capable of emitting light from triplet excitons, wherein the second light emitting unit includes a blue fluorescent light emitting layer capable of emitting light from singlet excitons, and wherein differences of the total thickness of the first light emitting unit and the total thickness of the third light emitting unit with the total thickness of the second light emitting unit are 30 nm to 70 nm.

(11) The organic electroluminescent element according to (10), wherein the first light emitting layer is a red phosphorescent light emitting layer that emits red light having a peak wavelength in a red wavelength range, wherein the second light emitting layer is a blue fluorescent light emitting layer that emits blue light having a peak wavelength in a blue wavelength range, and wherein the third light emitting layer is a green phosphorescent light emitting layer that emits green light having a peak wavelength in a green wavelength range.

(12) The organic electroluminescent element according to (10) or (11), wherein the thickness of the first functional layer is 30 to 70 nm.

(13) The organic electroluminescent element according to any one of (10) to (12), wherein the thickness of the third functional layer and the thickness of the fifth functional layer are 1 nm to 20 nm.

(14) The organic electroluminescent element according to any one of (10) to (13), wherein light emitted from the light emitting unit including the blue fluorescent light emitting layer includes a delayed fluorescent component.

(15) The organic electroluminescent element according to (10), wherein the total thickness of the second light emitting unit is smaller than both the total thickness of the first light emitting unit and the total thickness of the third light emitting unit.

(16) The organic electroluminescent element according to any one of (10) to (15), wherein the charge generating layer is an electrically insulating layer made of an electron accepting substance and an electron donating substance, and the resistivity of the electrically insulating layer is $1.0 \times 10^2$ Ω·cm or more.

(17) The organic electroluminescent element according to (16), wherein the resistivity of the electrically insulating layer is $1.0 \times 10^5$ Ω·cm or more.

(18) The organic electroluminescent element according to any one of (10) to (17), wherein the charge generating layer is a layer in which different substances are mixed, one component of the substances is a metal oxide, and the metal oxide forms a charge transfer complex due to a redox reaction, and wherein, when a voltage is applied between the cathode and the anode, charges in the charge transfer complex move toward the cathode and the anode, holes are injected into one light emitting unit positioned on the side of the cathode with sandwiching the charge generating layer, and electrons are injected into the other light emitting unit positioned on the side of the anode with sandwiching the charge generating layer.

(19) The organic electroluminescent element according to any one of (10) to (17), wherein the charge generating layer is made of a laminate of an electron accepting substance and an electron donating substance, and wherein, when a voltage is applied between the cathode and the anode, charges generated due to a reaction according to electron movement between the electron accepting substance and the electron donating substance move toward the cathode and the anode at the interface between the electron accepting substance and the electron donating substance, and thus holes are injected into one light emitting unit positioned on the side of the cathode with sandwiching the charge generating layer, and electrons are injected into the other light emitting unit positioned on the side of the anode with sandwiching the charge generating layer.

(20) The organic electroluminescent element according to any one of (10) to (17), wherein the charge generating layer is formed of a laminate or a mixture of a material according to the following Structural Formula (1) and another organic material.

[Chem. 1]

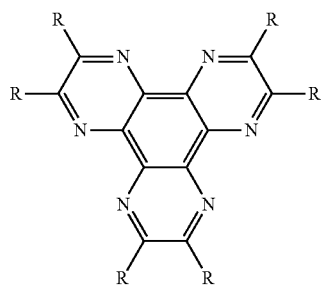

(1)

R = REPRESENTS AN ELECTRON
WITHDRAWING GROUP OF F,
Cl, Br, I, CN, and $CF_3$

(21) The organic electroluminescent element according to any one of (10) to (20),
wherein a luminescent color of the white light is classified into a light bulb color (L) or a warm white color (WW) in a chromaticity range defined "JIS Z 9112" and an average color rendering index (Ra) of the white light is 70 or more.
(22) A lighting device including the organic electroluminescent element according to any one of (10) to (21).

Advantageous Effects of Invention

As described above, according to the present invention, it is possible to provide an organic electroluminescent element capable of emitting light with high luminance and high efficiency and supporting a long lifespan, and a lighting device including such an organic electroluminescent element.

BRIEF DESCRIPTION OF DRAWINGS

FIG. 10A is a schematic diagram of a structure on a front side of an L-shaped wiring board for connection in the lighting device shown in FIG. 5.
FIG. 10B is a schematic diagram of a structure on a back side of the L-shaped wiring board for connection in the lighting device shown in FIG. 5.
FIG. 11 is a cross-sectional view of an element structure of an organic EL element of a first example.
FIG. 15 is a cross-sectional view of an element structure of an organic EL element of a third example.

DESCRIPTION OF EMBODIMENTS

Figure 1:
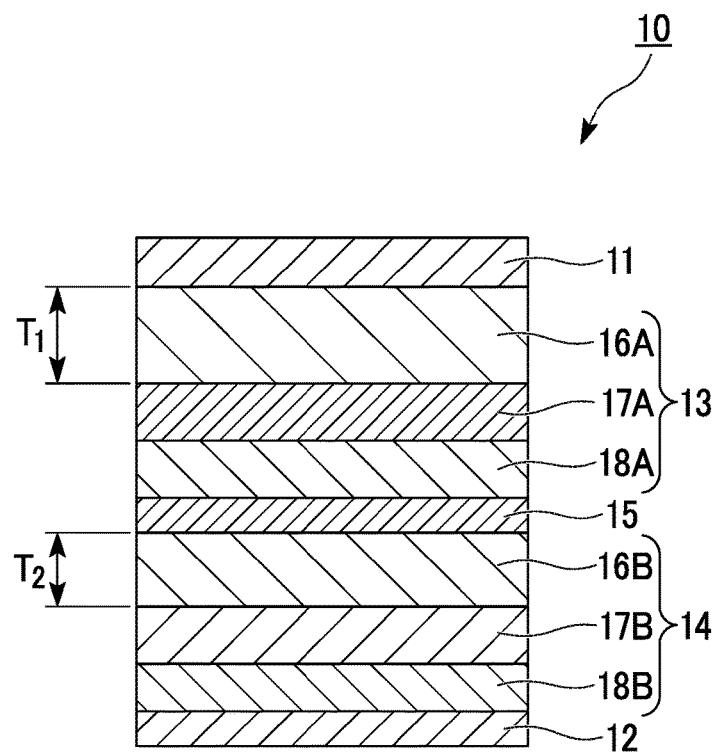
FIG. 1 is a cross-sectional view of a configuration of an organic EL element according to a first embodiment of the present invention.

An organic electroluminescent (EL) element and a lighting device to which the present invention is applied will be described below in detail with reference to the drawings.

Here, in the drawings used in the following description, in order to facilitate understanding of features, feature parts are enlarged for convenience of illustration in some cases, and dimensional ratios of components are not actually necessarily the same. In addition, the exemplary materials, dimensions, and the like in the following description are only examples, and the present invention is not necessarily limited thereto, and can be appropriately changed and implemented within ranges not changing the scope and spirit of the invention.

Organic EL Element

First Embodiment

First, an organic EL element 10 shown in FIG. 1 will be described as a first embodiment of the present invention.
Here, FIG. 1 is a cross-sectional view of a configuration of the organic EL element 10 according to the first embodiment of the present invention.
As shown in FIG. 1, the organic EL element 10 has a laminate structure in which a first light emitting unit 13 and a second light emitting unit 14 are included between a cathode 11 and an anode 12, and a first charge generating layer 15 is interposed between the first light emitting unit 13 and the second light emitting unit 14. That is, the organic EL element 10 has an MPE structure in which the anode 12, the second light emitting unit 14, the first charge generating layer 15, the first light emitting unit 13, and the cathode 11 are laminated in that order.
A metal having a small work function, an alloy thereof, a metal oxide, or the like is generally preferably used for the cathode 11. Specifically, a simple metal substance, for example, an alkali metal such as Li, an alkaline earth metal such as Mg or Ca, a rare earth metal such as Eu, or an alloy containing such a metal, and Al, Ag, In, or the like can be used.
In addition, for example, as disclosed in "Japanese Unexamined Patent Application, First Publication No. H10-270171" and "Japanese Unexamined Patent Application, First Publication No. 2001-102175," a configuration in which a metal-doped organic layer is used at the interface between the cathode 11 and the organic layer may be used. In this case, a conductive material may be used for the cathode 11, and properties such as a work function are not particularly limited.
In addition, for example, as disclosed in "Japanese Unexamined Patent Application, First Publication No. H11-233262" and "Japanese Unexamined Patent Application, First Publication No. 2000-182774," a configuration in which the organic layer in contact with the cathode 11 is made of an organic metal complex compound containing at least one of alkali metal ions, alkaline earth metal ions, and rare earth metal ions may be used. In this case, a metal that can reduce metal ions contained in the organic metal complex compound to a metal in a vacuum, for example, a (thermally reducible) metal such as Al, Zr, Ti, or Si or an alloy containing such metals can be used for the cathode 11. Among them, in particular, Al that is generally widely used for a wiring electrode is preferably used in consideration of easiness of deposition, high light reflectance, chemical stability, and the like.
A material of the anode 12 is not particularly limited. When light is extracted from the side of the anode 12, it is possible to use a transparent conductive material, for example, indium tin oxide (ITO), or indium zinc oxide (IZO).

In addition, when an ITO film is formed by a sputtering method that does not damage an organic film, for example, using a method disclosed in "Japanese Unexamined Patent Application, First Publication No. 2002-332567," the above metal-doped organic layer disclosed in "Japanese Unexamined Patent Application, First Publication No. H10-270171" is used as an electron injecting layer, and thus a transparent conductive material such as ITO or IZO described above can be used for the cathode 11.

Accordingly, both the cathode 11 and the anode 12 are made transparent (since the first and second light emitting units (organic films) 13 and 14 and the first charge generating layer 15 are also transparent), and it is possible to produce the transparent organic EL element 10. In addition, unlike a general organic EL element, when a metal material is used for the anode 12 and a transparent conductive material is used for the cathode 11, it is also possible to extract light from the side of the cathode 11. In addition, there is no need for a film formation sequence to necessarily start from the side of the anode 12, and film formation may start from the side of the cathode 11.

The first and second light emitting units 13 and 14 can have various structures similarly to organic EL elements known in the related art, and may have any laminate structure as long as at least a light emitting layer made of an organic compound is included. For example, a hole transporting layer, a hole injecting layer, an electron blocking layer, and the like can be arranged on the side of the anode 12 of the light emitting layer, whereas an electron transporting layer, an electron injecting layer, a hole blocking layer, and the like are arranged on the side of the cathode 11 of the light emitting layer.

Specifically, in the present embodiment, the first light emitting unit 13 has a structure in which a first functional layer 16A including an electron injecting layer and an electron transporting layer, a first light emitting layer 17A, and a second functional layer 18A including a hole transporting layer and a hole injecting layer are laminated between the cathode 11 and the first charge generating layer 15 in order from the side of the cathode 11.

In addition, in the present embodiment, the second light emitting unit 14 has a structure in which a third functional layer 16B including an electron injecting layer and an electron transporting layer, a second light emitting layer 17B, and a fourth functional layer 18B including a hole transporting layer and a hole injecting layer are laminated between the first charge generating layer 15 and the anode 12 in order from the side of the first charge generating layer 15.

The electron transporting layer (ETL) may be formed using an electron transporting substance known in the related art. Among electron transporting substances that are generally used for an organic EL element, a substance having a relatively deep highest occupied molecular orbital (HOMO) level is preferable. Specifically, an electron transporting substance having a HOMO level of at least about 6.0 eV or more is preferably used.

In order to increase efficiency of electron injection from the cathode 11 or the first charge generating layer 15, the electron injecting layer is inserted between the cathode 11 and the electron transporting layer, or between the first charge generating layer 15 and the electron transporting layer positioned on the side of the anode 12, and generally, an electron transporting substance having the same properties as the electron transporting layer is used. Here, the electron transporting layer and the electron injecting layer may be collectively referred to as an electron transporting layer.

The hole transporting layer may be formed using a hole transporting substance known in the related art and the material thereof is not particularly limited. For example, an organic compound (electron donating substance) having an ionization potential of less than 5.7 eV and a hole transporting property, that is, an electron donating property, is preferably used. In order to increase efficiency of hole injection from the anode 12 or the first charge generating layer 15, the hole injecting layer is inserted between the anode 12 and the hole transporting layer, or between the first charge generating layer 15 and the hole transporting layer positioned on the side of the cathode 11, and generally, an electron donating substance having the same properties as the hole transporting layer is used. Here, the hole transporting layer and the hole injecting layer may be collectively referred to as a hole transporting layer.

As a film formation method of layers constituting the first and second light emitting units 13 and 14, for example, a vacuum deposition method or a spin coating method can be used. In addition, materials known in the related art can be used for the electron transporting layer, the electron injecting layer, the hole blocking layer, the hole transporting layer, and the hole injecting layer described above.

The first and second light emitting layers 17A and 17B include, as organic compounds, a host material which is usually a main component, and a guest material which is a minor component. Emission of red, green, or blue light is particularly due to properties of the guest material.

The guest material is also called a dopant material. The guest material utilizing fluorescent light emission is generally called a fluorescent light emitting material. A light emitting layer made of the fluorescent light emitting material is called a fluorescent light emitting layer. On the other hand, the guest material utilizing phosphorescent light emission is generally called a phosphorescent light emitting material. A light emitting layer made of the phosphorescent light emitting material is called a phosphorescent light emitting layer.

Among them, in the phosphorescent light emitting layer, in addition to 75% of triplet excitons generated according to recombination of electrons and holes, since 25% of triplet excitons generated due to energy transfer from singlet excitons can be used, theoretically, internal quantum efficiency of 100% can be obtained. That is, excitons generated according to recombination of electrons and holes are converted into light without causing heat loss or the like in the light emitting layer. Actually, in an organic metal complex containing heavy atoms such as iridium and platinum, internal quantum efficiency close to 100% is achieved according to optimization of an element structure and the like.

The guest material of the phosphorescent light emitting layer is not particularly limited. For example, a red phosphorescent light emitting material such as $Ir(piq)_3$ and $Ir(btpy)_3$ can be used for a red phosphorescent light emitting layer. On the other hand, a green phosphorescent light emitting material such as $Ir(ppy)_3$ can be used for a green phosphorescent light emitting layer. On the other hand, a blue phosphorescent light emitting material such as $Ir(Fppy)_3$ can be used for a blue phosphorescent light emitting layer. As specific phosphorescent light emitting materials, 688118-250MG, 680877-250MG, 694924-250MG, and 682594-250MG (commercially available from Sigma-Aldrich Co. LLC.) are exemplary examples.

As the host material of the phosphorescent light emitting layer, an electron transporting material, a hole transporting material, or a mixture of both can be used. Specifically, for example, 4,4'-biscarbazolylbiphenyl (CBP) and 2,9-dimethyl-4,7-diphenyl-9,10-phenanthroline (BCP) can be used.

However, in the present invention, in order to increase an element lifespan and realize high color rendering, a blue fluorescent light emitting material is preferably used as the guest material of the blue light emitting layer. Regarding the host material and the guest material of the blue fluorescent light emitting layer, for example, a blue fluorescent light emitting material described in paragraphs [0052] to [0061] in "PCT International Publication No. WO 2012/053216" can be used. In addition, as the guest material, for example, a styrylamine compound, a fluoranthene compound, an aminopyrene compound, and a boron complex can be used. In addition, light emitted from the light emitting unit including the blue fluorescent light emitting layer preferably includes a delayed fluorescent component.

The first charge generating layer 15 is an electrically insulating layer made of an electron accepting substance and an electron donating substance. The resistivity of the electrically insulating layer is preferably $1.0 \times 10^2$ Ω·cm or more and more preferably $1.0 \times 10^5$ Ω·cm or more.

In addition, the first charge generating layer 15 is a layer in which different substances are mixed, one component of the substances is a metal oxide, and the metal oxide forms a charge transfer complex due to a redox reaction. In this case, when a voltage is applied between the cathode 11 and the anode 12, charges in the charge transfer complex move toward the cathode 11 and the anode 12, and thus holes are injected into one light emitting unit (the first light emitting unit 13 or the second light emitting unit 14) positioned on the side of the cathode 11 with the first charge generating layer 15 therebetween, and electrons are injected into the other light emitting unit (the second light emitting unit 14 or the first light emitting unit 13) positioned on the side of the anode 12 with the first charge generating layer 15 therebetween. Therefore, since light beams are emitted from the first and second light emitting units 13 and 14 at the same time at the same amperage, it is possible to obtain current efficiency and external quantum efficiency corresponding to the number of light emitting units 13 and 14.

The first charge generating layer 15 may be made of a laminate of an electron accepting substance and an electron donating substance. In this case, when a voltage is applied between the cathode 11 and the anode 12, charges generated due to a reaction according to electron movement between the electron accepting substance and the electron donating substance move toward the cathode 11 and the anode 12 at the interface between the electron accepting substance and the electron donating substance. Therefore, holes are injected into one light emitting unit (the first light emitting unit 13 or the second light emitting unit 14) positioned on the side of the cathode 11 with the first charge generating layer 15 therebetween, and electrons are injected into the other light emitting unit (the second light emitting unit 14 or the first light emitting unit 13) positioned on the side of the anode 12 with the first charge generating layer 15 therebetween. Accordingly, since light beams are emitted from the first and second light emitting units 13 and 14 at the same time at the same amperage, it is possible to obtain current efficiency and external quantum efficiency corresponding to the number of light emitting units 13 and 14.

As specific materials forming the first charge generating layer 15, for example, materials described in Patent Literature 9 can be used. Among them, materials described in paragraphs [0019] to [0021] can be suitably used. Furthermore, materials described in paragraphs [0023] to [0026] in "PCT International Publication No. WO2010/113493" can be used. Among them, particularly, a strong electron accepting substance (HATCN6) according to the following Structural Formula (1) described in paragraph [0059] is a material that has recently been frequently used for the first charge generating layer 15.

In addition, the first charge generating layer 15 is preferably formed of a laminate or a mixture of the strong electron accepting substance (HATCN6) according to the following Structural Formula (1) and another organic material.

[Chem. 2]

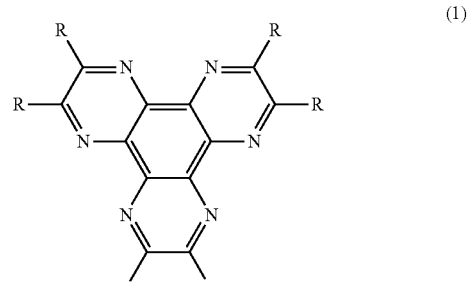

R = REPRESENTS AN ELECTRON
WITHDRAWING GROUP OF F,
Cl, Br, I, CN, and CF$_3$

In the organic EL element 10 having the structure described above, when the first light emitting unit 13 and the second light emitting unit 14 emit light, white light can be obtained. In addition, in the organic EL element 10 of the present embodiment, white light corresponding to any light color of a light bulb color (L) and a warm white color (WW) in a chromaticity range defined in "JIS Z 9112" is preferably obtained. In addition, in the organic EL element 10 of the present embodiment, white light having an average color rendering index (Ra) of 70 or more (more preferably 80 or more) is preferably obtained. Accordingly, the organic EL element 10 of the present embodiment can be suitably used as a light source of a lighting device, for example, a general lighting device.

Incidentally, in the present embodiment, in order to obtain the organic EL element 10 capable of emitting light with high luminance and high efficiency and supporting a long lifespan, the thickness $T_1$ of the first functional layer 16A is preferably 30 nm to 100 nm.

In the organic EL element 10 of the present embodiment, when the thickness $T_1$ of the first functional layer 16A including an electron transporting layer increases, external quantum efficiency (EQE) increases because an interference influence and a plasmon loss decrease. On the other hand, when the thickness $T_1$ of the first functional layer 16A increases, a driving voltage also increases. Specifically, when the thickness $T_1$ of the first functional layer 16A is less than 30 nm, an increase in EQE is insufficient. On the other hand, when the thickness $T_1$ of the first functional layer 16A exceeds 100 nm, power conversion efficiency (PCE) decreases. Accordingly, the thickness $T_1$ of the first functional layer 16A is preferably 30 nm to 100 nm and more preferably 30 to 70 nm.

Here, EQE refers to external quantum efficiency. This is a ratio obtained by dividing the number of photons extracted to the outside by the number of carriers injected into the element, and is often used as an index of light emission efficiency. However, since calculation results of EQE do not include parameters of a driving voltage, the ratio is an inappropriate index when the effect of lowering a voltage is discussed. In that case, energy conversion efficiency called PCE is often used. This is a ratio obtained by dividing output energy by input energy. Since input energy corresponds to power consumption, a difference in the driving voltage is reflected in an efficiency value of PCE.

In addition, in the present embodiment, in order to obtain the organic EL element 10 capable of emitting light with high luminance and high efficiency and supporting a long lifespan, the thickness $T_2$ of the third functional layer 16B is preferably smaller than the thickness $T_1$ of the first functional layer 16A. Specifically, the thickness $T_2$ of the third functional layer 16B is preferably 1 nm to 20 nm.

In the organic EL element 10 of the present embodiment, in order to prevent an increase in the driving voltage due to the increase in the thickness $T_2$ of the third functional layer 16B including an electron transporting layer, the thickness $T_2$ of the third functional layer 16B is smaller than the thickness $T_1$ of the first functional layer 16A. Accordingly, it is possible to prevent a decrease in PCE.

Specifically, the thickness $T_2$ of the third functional layer 16B is preferably 20 nm or less and more preferably 10 nm or less. On the other hand, the thickness $T_2$ of the third functional layer 16B is preferably 1 nm or more. When the thickness $T_2$ of the third functional layer 16B is extremely thin, it is not preferable in consideration of an influence on the morphology of a thin film.

In the organic EL element 10 of the present embodiment, while the lamination order of the first light emitting unit 13 and the second light emitting unit 14 is not particularly limited in terms of a device structure, preferably, the first light emitting unit 13 includes the phosphorescent light emitting layer capable of emitting light from triplet excitons, and the second light emitting unit 14 includes the blue fluorescent light emitting layer capable of emitting light from singlet excitons.

This is because, while light emission efficiency increases due to the above effect described in paragraph [0046] in the first light emitting unit 13, the effect of reducing a plasmon loss is weakened because a sufficient optical distance to the cathode 11 is ensured due to the MPE structure in the second light emitting unit. As a result, since the first light emitting unit 13 has a stronger effect of increasing light emission efficiency than the second light emitting unit 14, preferably, the first light emitting unit 13 includes the phosphorescent light emitting layer having high light emission efficiency, and the second light emitting unit 14 includes the blue fluorescent light emitting layer.

As described above, the organic EL element 10 of the present embodiment has advantages such as that high luminance and a long lifespan are maintained by using the MPE structure and can increase power efficiency by adopting an element structure in which low voltage driving is possible.

Second Embodiment

Next, an organic EL element 20 shown in FIG. 2 will be described as a second embodiment of the present invention.

Figure 2:
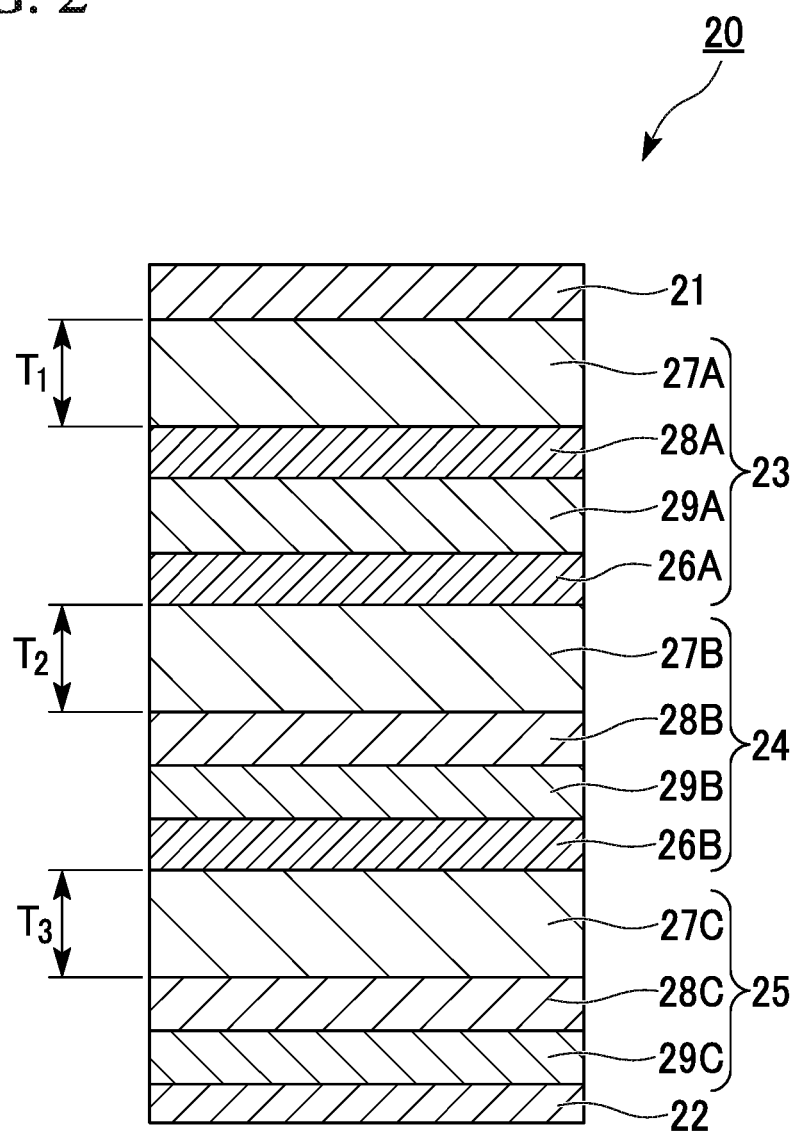
FIG. 2 is a cross-sectional view of a configuration of an organic EL element according to a second embodiment of the present invention.

Here, FIG. 2 is a cross-sectional view of a configuration of the organic EL element 20 according to the second embodiment of the present invention. In addition, in the following description, portions the same as in the organic EL element 10 are not described and are denoted with the same reference numerals in the drawings.

As shown in FIG. 2, the organic EL element 20 includes a first light emitting unit 23, a second light emitting unit 24, and a third light emitting unit 25 between a cathode 21 and an anode 22. A first charge generating layer 26A constituting the first light emitting unit 23 is provided on the side of the second light emitting unit 24 and serves as a boundary between the first light emitting unit 23 and the second light emitting unit 24. A second charge generating layer 26B constituting the second light emitting unit 24 is provided on the side of the third light emitting unit 25 and serves as a boundary between the second light emitting unit 24 and the third light emitting unit 25. That is, the organic EL element 20 has an MPE structure in which the cathode 21, the first light emitting unit 23, the second light emitting unit 24, the third light emitting unit 25, and the anode 22 are laminated in that order.

The same cathode 11 and anode 12 included in the organic EL element 10 can be used as the cathode 21 and the anode 22. In addition, the same first charge generating layer 15 included in the organic EL element 10 can be used as the first and second charge generating layers 26A and 26B.

Similarly to the first and second light emitting units 13 and 14 included in the organic EL element 10, the first, second, and third light emitting units 23, 24, and 25 can have various structures like organic EL elements known in the related art and may have any laminate structure as long as at least a light emitting layer made of an organic compound is included. For example, while an electron transporting layer, an electron injecting layer, a hole blocking layer and the like are arranged on the side of the cathode 21 of the light emitting layer, a hole transporting layer, a hole injecting layer, and the like can be arranged on the side of the anode 22 of the light emitting layer.

Specifically, in the present embodiment, the first light emitting unit 23 has a structure in which a first functional layer 27A including an electron injecting layer and an electron transporting layer, a first light emitting layer 28A, a second functional layer 29A including a hole transporting layer and a hole injecting layer, and the first charge generating layer 26A are laminated between the cathode 21 and a third functional layer 27B constituting the second light emitting unit 24 in order from the side of the cathode 21.

The first light emitting layer 28A is, for example, a red phosphorescent light emitting layer that emits red light having a peak wavelength in a red wavelength range.

In addition, in the present embodiment, the second light emitting unit 24 has a structure in which the third functional layer 27B including an electron injecting layer and an electron transporting layer, a second light emitting layer 28B, a fourth functional layer 29B including a hole transporting layer and a hole injecting layer, and the second charge generating layer 26B are laminated between the first charge generating layer 26A constituting the first light emitting unit 23 and a fifth functional layer 27C constituting the third light emitting unit 25 in order from the side of the first charge generating layer 26A.

The second light emitting layer 28B is, for example, a blue fluorescent light emitting layer that emits blue light having a peak wavelength in a blue wavelength range.

In addition, in the present embodiment, the third light emitting unit 25 has a structure in which a fifth functional layer 27C including an electron injecting layer and an electron transporting layer, a third light emitting layer 28C, and a sixth functional layer 29C including a hole transporting layer and a hole injecting layer are laminated between the second charge generating layer 26B constituting the second light emitting unit 24 and the anode 22 in order from the side of the second charge generating layer 26B.

The third light emitting layer 28C is, for example, a green phosphorescent light emitting layer that emits green light having a peak wavelength in a green wavelength range.

The first light emitting layer 28A is a red phosphorescent light emitting layer constituting the first light emitting unit 23, and includes, as organic compounds, a host material which is usually a main component and a guest material which is a minor component. Emission of red light is particularly due to properties of the guest material.

The second light emitting layer 28B is a blue fluorescent light emitting layer constituting the second light emitting unit 24, and includes, as organic compounds, a host material which is usually a main component and a guest material which is a minor component. Emission of blue light is particularly due to properties of the guest material.

The third light emitting layer 28C is a green phosphorescent light emitting layer constituting the third light emitting unit 25, and includes, as organic compounds, a host material which is usually a main component and a guest material which is a minor component. Emission of green light is particularly due to properties of the guest material.

The guest material is also called a dopant material. The guest material utilizing fluorescent light emission is generally called a fluorescent light emitting material. A light emitting layer made of the fluorescent light emitting material is called a fluorescent light emitting layer. On the other hand, the guest material utilizing phosphorescent light emission is generally called a phosphorescent light emitting material. A light emitting layer made of the phosphorescent light emitting material is called a phosphorescent light emitting layer.

Among them, in the phosphorescent light emitting layer, in addition to 75% of triplet excitons generated according to recombination of electrons and holes, since 25% of triplet excitons generated due to energy transfer from singlet excitons can be used, theoretically, internal quantum efficiency of 100% can be obtained. That is, excitons generated according to recombination of electrons and holes are converted into light without causing heat loss or the like in the light emitting layer. Actually, in an organic metal complex containing heavy atoms such as iridium and platinum, internal quantum efficiency close to 100% is achieved according to optimization of an element structure and the like.

The guest material of the phosphorescent light emitting layer is not particularly limited. For example, a red phosphorescent light emitting material such as $Ir(piq)_3$ and $Ir(btpy)_3$ can be used for a red phosphorescent light emitting layer. On the other hand, a green phosphorescent light emitting material such as $Ir(ppy)_3$ can be used for a green phosphorescent light emitting layer. As specific phosphorescent light emitting materials, 688118-250MG, 680877-250MG, and 682594-250MG (commercially available from Sigma-Aldrich Co. LLC.) are exemplary examples.

As the host material of the phosphorescent light emitting layer, an electron transporting material, a hole transporting material, or a mixture of both can be used. Specifically, for example, 4,4'-biscarbazolylbiphenyl (CBP), and 2,9-dimethyl-4,7-diphenyl-9,10-phenanthroline (BCP) can be used.

However, in the present invention, in order to increase an element lifespan and realize high color rendering, a blue fluorescent light emitting material is preferably used as the guest material of the blue light emitting layer. Regarding the host material and the guest material of the blue fluorescent light emitting layer, for example, a blue fluorescent light emitting material described in paragraphs [0052] to [0061] in "PCT International Publication No. WO 2012/053216" can be used. In addition, as the guest material, for example, a styrylamine compound, a fluoranthene compound, an aminopyrene compound, and a boron complex can be used. In addition, light emitted from the light emitting unit including the blue fluorescent light emitting layer preferably includes a delayed fluorescent component.

The first and second charge generating layers 26A and 26B are electrically insulating layers made of an electron accepting substance and an electron donating substance. The resistivity of the electrically insulating layer is preferably $1.0 \times 10^2$ Ω·cm or more and more preferably $1.0 \times 10^5$ Ω·cm or more.

In addition, the first and second charge generating layers 26A and 26B may be layers in which different substances are mixed, one component of the substances is a metal oxide, and the metal oxide forms a charge transfer complex due to a redox reaction. In this case, when a voltage is applied between the cathode 21 and the anode 22, charges in the charge transfer complex move toward the cathode 21 and the anode 22. Therefore, holes are injected into a portion (a portion of the first light emitting unit 23 excluding the first charge generating layer 26A) of one light emitting unit positioned on the side of the cathode 21 with the first charge generating layer 26A therebetween, electrons are injected into one light emitting unit (the second light emitting unit 24) positioned on the side of the anode 22 with the first charge generating layer 26A therebetween, holes are injected into a portion (a portion of the second light emitting unit 24 excluding the second charge generating layer 26B) of one light emitting unit positioned on the side of the cathode 21 with the second charge generating layer 26B therebetween, and electrons are injected into one light emitting unit (the third light emitting unit 25) positioned on the side of the anode 22 with the second charge generating layer 26B therebetween. Accordingly, since light beams are emitted from the first, second, and third light emitting units 23, 24, and 25 at the same time at the same amperage, it is possible to obtain current efficiency and external quantum efficiency corresponding to the number of light emitting units 23, 24, and 25.

The first and second charge generating layers 26A and 26B may be made of a laminate of an electron accepting substance and an electron donating substance. In this case, when a voltage is applied between the cathode 21 and the anode 12, charges generated due to a reaction according to electron movement between the electron accepting substance and the electron donating substance move toward the cathode 21 and the anode 22 at the interface between the electron accepting substance and the electron donating substance. Therefore, holes are injected into a portion (a portion of the first light emitting unit 23 excluding the first charge generating layer 26A) of one light emitting unit positioned on the side of the cathode 21 with the first charge generating layer 26A therebetween, electrons are injected into one light emitting unit (the second light emitting unit 24) positioned on the side of the anode 22 with the first charge generating layer 26A therebetween, holes are injected into a portion (a portion of the second light emitting unit 24 excluding the second charge generating layer 26B) of one light emitting unit positioned on the side of the cathode 21 with the second charge generating layer 26B therebetween, and electrons are injected into one light emitting unit (the third light emitting unit 25) positioned on the side of the anode 22 with the second charge generating layer 26B therebetween. Accordingly, since light beams are emitted from the first, second, and third light emitting units 23, 24, and 25 at the same time at the same amperage, it is possible to obtain current efficiency and external quantum efficiency corresponding to the number of light emitting units 23, 24, and 25.

As specific materials forming the first and second charge generating layers 26A and 26B, for example, materials described in Patent Literature 9 can be used. Among them, materials described in paragraphs [0019] to [0021] can be suitably used. Furthermore, materials described in paragraphs [0023] to [0026] in "PCT International Publication No. WO2010/113493" can be used. Among them, particularly, a strong electron accepting substance according to the following Structural Formula (1) described in paragraph [0059] is a material that has recently been frequently used for the first charge generating layer 26A.

In addition, the first charge generating layer 26A is preferably formed of a laminate or a mixture of the strong electron accepting substance according to the following Structural Formula (1) and another organic material.

[Chem. 3]

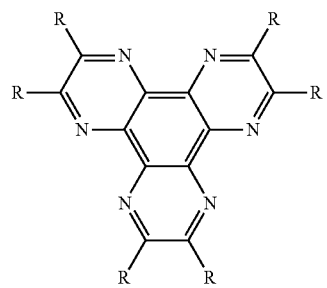

(1)

R = REPRESENTS AN ELECTRON WITHDRAWING GROUP OF F, Cl, Br, I, CN, and CF$_3$

In the organic EL element 20 having the structure described above, when the first light emitting unit 23, the second light emitting unit 24, and the third light emitting unit 25 emit light, white light can be obtained. In addition, in the organic EL element 20 of the present embodiment, white light corresponding to any light color of a light bulb color (L) and a warm white color (WW) in a chromaticity range defined in "JIS Z 9112" is preferably obtained. In addition, in the organic EL element 20 of the present embodiment, white light having an average color rendering index (Ra) of 70 or more (more preferably 80 or more) is preferably obtained. Accordingly, the organic EL element 20 of the present embodiment can be suitably used as a light source of a lighting device, for example, a general lighting device.

In the present embodiment, in order to obtain the organic EL element 20 capable of emitting light with high luminance and high efficiency and supporting a long lifespan, the thickness $T_1$ of the first functional layer 27A is preferably 30 nm to 70 nm, similarly to the organic EL element 10.

In addition, in the present embodiment, in order to obtain the organic EL element 20 capable of emitting light with high luminance and high efficiency and supporting a long lifespan, the thicknesses $T_2$ and $T_3$ of the third and fifth functional layers 27B and 27C are preferably smaller than the thickness $T_1$ of the first functional layer 27A. Specifically, the thicknesses $T_2$ and $T_3$ of the third and fifth functional layers 27B and 27C are preferably 1 nm to 20 nm.

In the organic EL element 20 of the present embodiment, while the lamination order of the first, second, and third light emitting units 23, 24, and 25 is not particularly limited in terms of a device structure, preferably, the second light emitting unit 24 includes the blue fluorescent light emitting layer capable of emitting light from singlet excitons.

Here, regarding Example 1 in a third example to be described below, the film thickness from the light emitting layer in each light emitting unit to the cathode, and the proportions of plasmon loss and an external radiation mode at that time were computed by simulation software, and the results are shown in Table 1.

TABLE 1

| | DISTANCE FROM CATHODE TO | PROPORTION OF EACH MODE LIGHT (%) | |
|---|---|---|---|
| | LIGHT EMITTING LAYER(nm) | PLASMON LOSS | EXTERNAL RADIATION |
| FIRST LIGHT EMITTING UNIT | 48 | 38 | 19 |
| SECOND LIGHT EMITTING UNIT | 151.6 | 23 | 8 |
| THIRD LIGHT EMITTING UNIT | 235.2 | 18 | 19 |

Based on the results shown in Table 1, the proportion of the plasmon loss decreases as the film thickness from the cathode 21 increases. On the other hand, the second light emitting unit 24 has the lowest value in the external radiation mode among read values. Accordingly, the first light emitting unit 23 and the third light emitting unit 25 include the phosphorescent light emitting layer having high light emission efficiency and the second light emitting unit 24 includes the blue fluorescent light emitting layer, and thus it is possible to emit light in a light bulb color or a warm white color in a chromaticity range defined in "JIS Z 9112" with high luminance and high efficiency.

On the other hand, decreasing a driving voltage is important for increasing light emission efficiency (1 m/W). The driving voltage is generally determined by the film thickness (total thickness) of all organic layers in the light emitting units 23, 24, and 25. In order to decrease the driving voltage, decreasing the total thickness of the light emitting units 23, 24, and 25 is effective.

However, in the first light emitting unit 23, it is necessary to secure a constant film thickness between the first light emitting layer 28A and the cathode 21 in order to decrease the plasmon loss, and thus the total thickness cannot be extremely thin. In addition, in the third light emitting unit 25, it is necessary to increase the thickness of the hole transporting layer (the sixth functional layer 29C) in order to prevent short circuiting of the organic EL element 20, and thus the total thickness cannot be extremely thin.

Therefore, in the organic EL element 20 of the present embodiment, in order to decrease a voltage, the total thickness of the second light emitting unit 24 including the blue fluorescent light emitting layer capable of emitting light from singlet excitons is preferably thin. Further, the total thickness of the second light emitting unit 24 is preferably smaller than both the total thickness of the first light emitting unit 23 and the total thickness of the third light emitting unit 25.

Here, in Example 1 in the third example to be described below, the total thicknesses of the light emitting units are shown in Table 2.

TABLE 2

|  | TOTAL THICKNESS(nm) |
|---|---|
| FIRST LIGHT EMITTING UNIT | 136.6 |
| SECOND LIGHT EMITTING UNIT | 93.6 |
| THIRD LIGHT EMITTING UNIT | 140 |

Differences of the total thickness of the first light emitting unit 23 and the total thickness of the third light emitting unit 25 with the total thickness of the second light emitting unit 24 are preferably 10 to 95 nm, and more preferably 30 nm to 70 nm. When the difference between the total thickness of the second light emitting unit 24 and the total thickness of the first light emitting unit 23 is less than 10 nm, an optical distance from the second light emitting layer 28B constituting the second light emitting unit 24 to the cathode 21 is insufficient, and the effect of reducing a plasmon loss described in paragraph [0074] is insufficient. On the other hand, when the difference between the total thickness of the second light emitting unit 24 and the total thickness of the first light emitting unit 23 exceeds 95 nm, the total thickness of the entire organic EL element 20 increases and light emission efficiency decreases due to an increase in the driving voltage.

In addition, when the difference between the total thickness of the second light emitting unit 24 and the total thickness of the third light emitting unit 25 is less than 30 nm, it may not be possible to decrease the total thickness of the second light emitting unit 24 or it may not be possible to increase the film thickness of the third light emitting unit 25. In the former case, the effect of reducing a driving voltage is insufficient. In the latter case, since it is not possible to ensure a sufficient thickness of the hole transporting layer, the effect of preventing short circuiting in the element described in paragraph [0074] is weakened. On the other hand, when the difference between the total thickness of the second light emitting unit 24 and the total thickness of the third light emitting unit 25 exceeds 70 nm, the total thickness of the entire organic EL element 20 increases and light emission efficiency decreases due to an increase in the driving voltage.

As described above, the organic EL element 20 of the present embodiment has advantages such as that high luminance and a long lifespan are maintained by using the MPE structure and can increase power efficiency by adopting an element structure in which low voltage driving is possible.

Lighting Device

Third Embodiment

Figure 3:
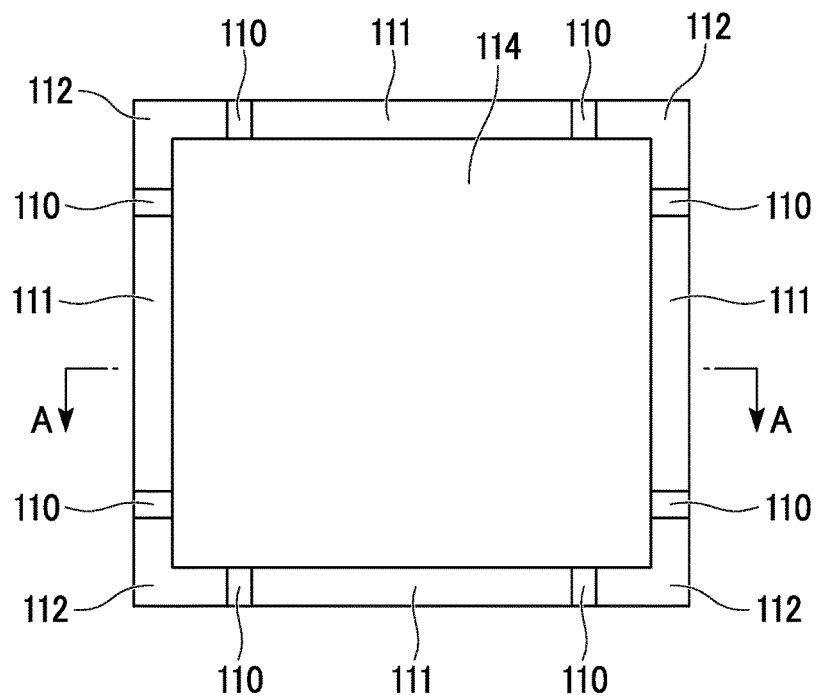
FIG. 3 is a plan view of a configuration of a lighting device according to a third embodiment of the present invention.
Figure 4:
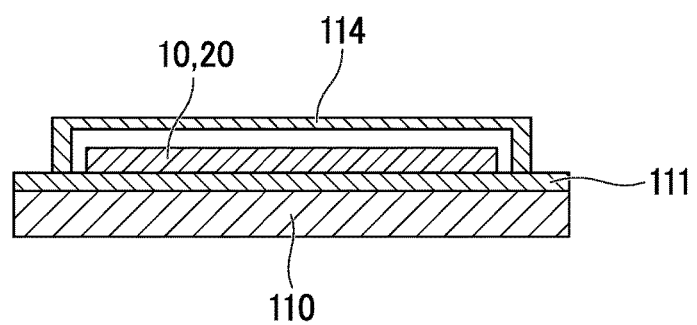
FIG. 4 is a cross-sectional view of the lighting device taken along the line segment A-A shown in FIG. 3.

Next, a lighting device 100 shown FIG. 3 to FIG. 10A and FIG. 10B will be described as a third embodiment of the present invention. Here, FIG. 3 is a plan view of a configuration of the lighting device 100 according to the third embodiment of the present invention. FIG. 4 is a cross-sectional view of the lighting device 100 taken along the line segment A-A shown in FIG. 3. In addition, the lighting device 100 is an example of a lighting device to which the present invention is applied and is not necessarily limited to such a configuration, but can be appropriately changed.

The lighting device 100 includes any of the above organic EL elements 10 and 20 as a light source.

Specifically, as shown in FIG. 3 and FIG. 4, in the lighting device 100, in order for the large area organic EL elements 10 and 20 to emit light uniformly, an anode terminal electrode 111 is formed on four sides of a glass substrate 110, and a cathode terminal electrode 112 is formed on four corners of the glass substrate 110. Here, in order to reduce wiring resistance, solder (base solder) is applied over the entire surface of the anode terminal electrode 111 and the entire surface of the cathode terminal electrode 112. Then, according to the anode terminal electrode 111 and the cathode terminal electrode 112, a current is uniformly supplied to the organic EL elements 10 and 20 in four directions.

In addition, in order to prevent performance degradation of the organic EL elements 10 and 20 due to oxygen, water, or the like, a sealing material 114 is formed to cover the organic EL elements 10 and 20 on the glass substrate 110.

Here, the glass substrate 110 is used as a substrate in the present embodiment. However, in addition thereto, a material such as a plastic, a metal, and a ceramic can be used as the substrate.

Figure 5:
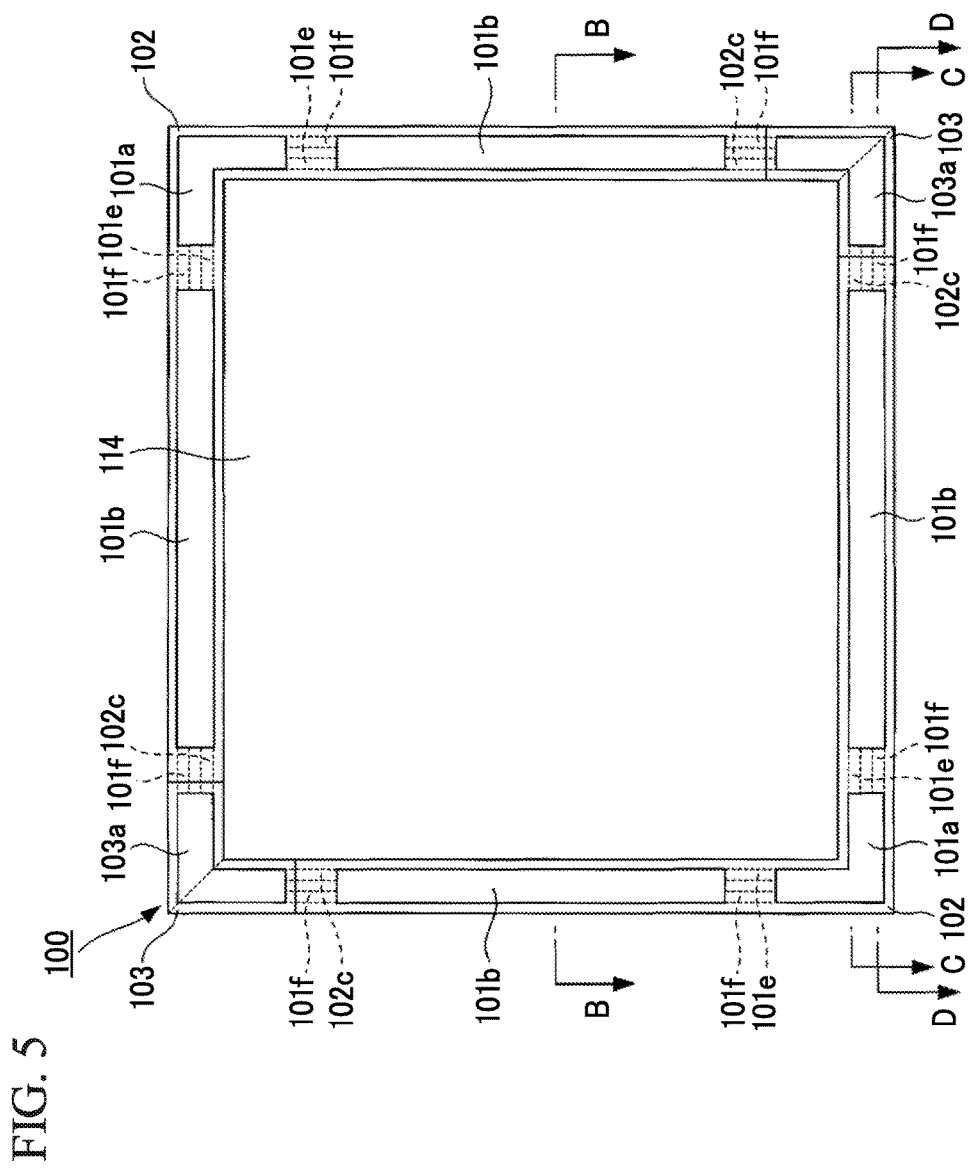
FIG. 5 is a plan view of a configuration in which an anode terminal electrode and a cathode terminal electrode of the lighting device shown in FIG. 3 are not shown.
Figure 6:
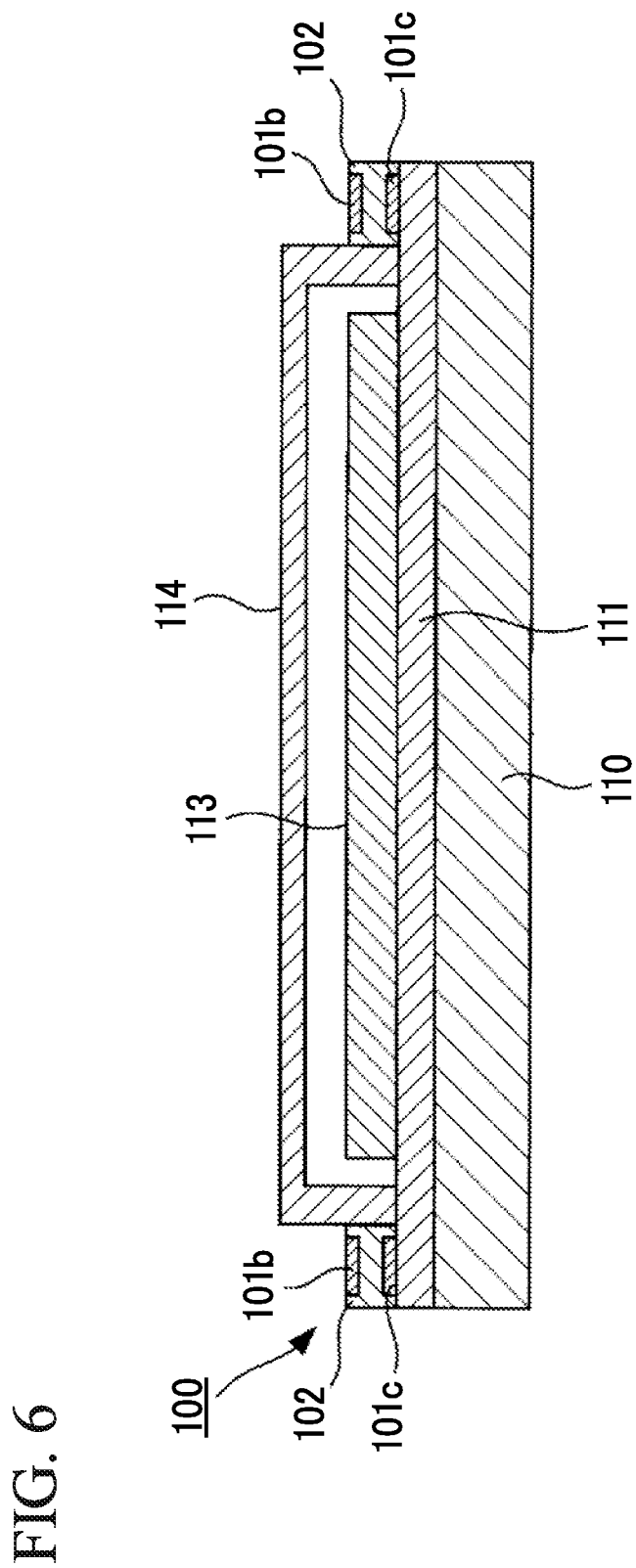
FIG. 6 is a cross-sectional view of the lighting device taken along the line segment B-B shown in FIG. 5.
Figure 7:
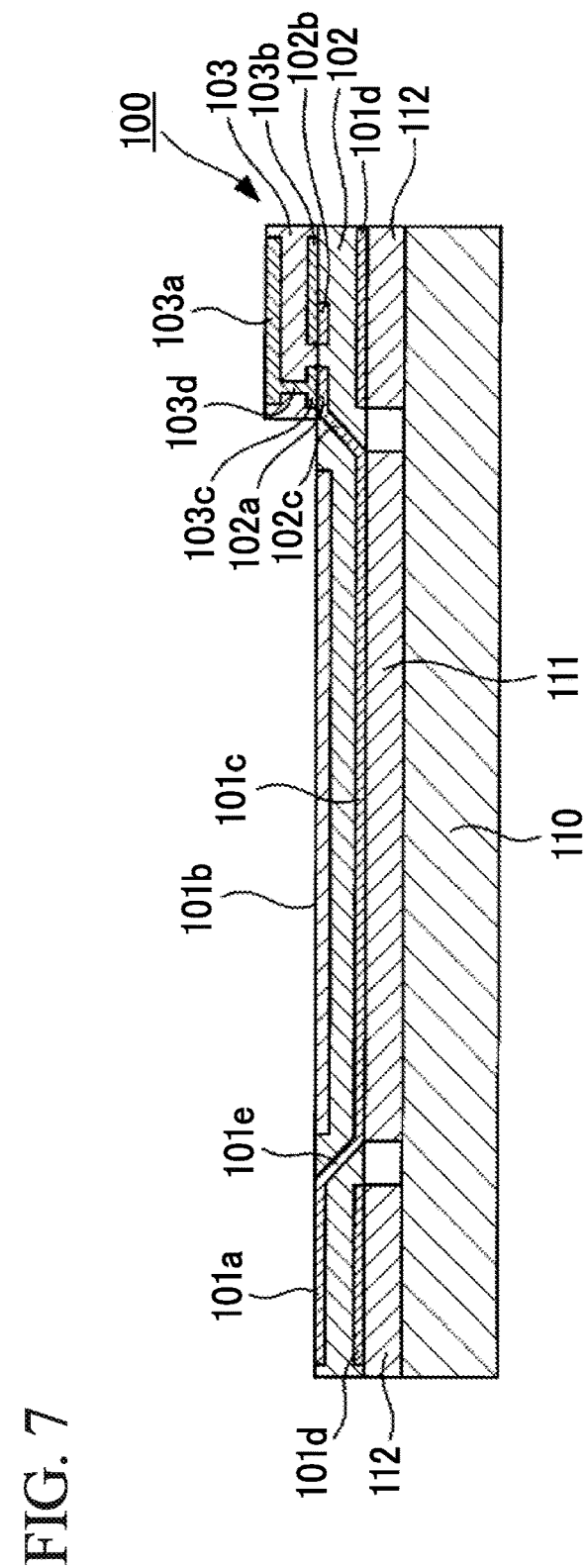
FIG. 7 is a cross-sectional view of the lighting device taken along the line segment C-C shown in FIG. 5.
Figure 8:
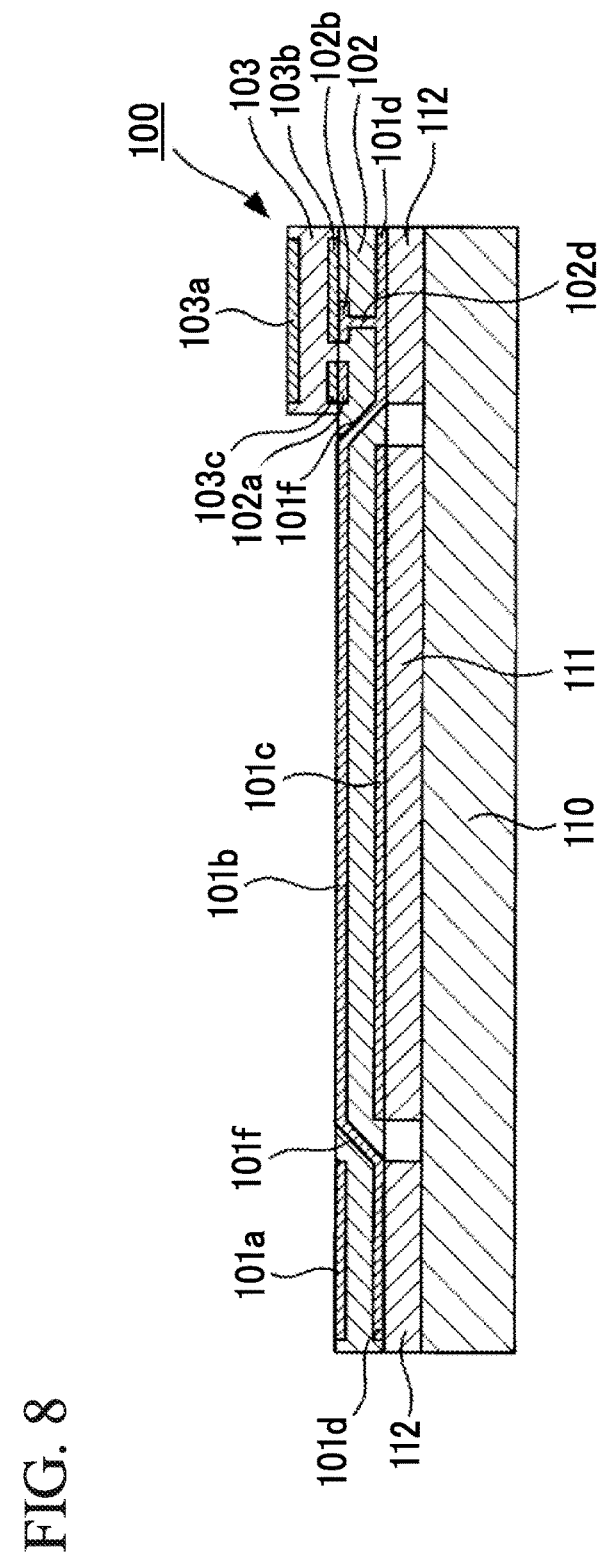
FIG. 8 is a cross-sectional view of the lighting device taken along the line segment D-D shown in FIG. 5.

FIG. 5 is a plan view of a configuration in which the anode terminal electrode 111 and the cathode terminal electrode 112 of the lighting device 100 shown in FIG. 3 are not shown. FIG. 6 is a cross-sectional view of the lighting device taken along the line segment B-B shown in FIG. 5. FIG. 7 is a cross-sectional view of the lighting device taken along the line segment C-C shown in FIG. 5. FIG. 8 is a cross-sectional view of the lighting device taken along the line segment D-D shown in FIG. 5. Here, in FIG. 5 to FIG. 8, while a power supply terminal portion including the anode terminal electrode 111 and the cathode terminal electrode 112 is not shown, the power supply terminal portion is actually formed.

As shown in FIG. 5, the lighting device 100 includes a frame-like wiring board 101 in which an anode wiring 101a for uniformly supplying power to the four positive electrode terminal electrodes 111 and a cathode wiring 101b for uniformly supplying power to the four cathode terminal electrodes 112 are formed.

Here, in the present embodiment, the wiring board 101 is disposed to surround the sealing material 114.

In addition, a glass epoxy substrate or a flexible printed circuit substrate is used as a material of the wiring board 101. In addition, the thickness of the wiring board 101 is about 0.2 mm to 0.5 mm.

As shown in FIG. 6 to FIG. 8, an anode electrode 101c connected to the anode terminal electrode 111 is formed at a position corresponding to the anode terminal electrode 111 on the back surfaces of four sides of the wiring board 101. In addition, a cathode electrode 101d connected to the cathode terminal electrode 112 is formed at a position corresponding to the cathode terminal electrode 112 on the back surfaces of four corners of the wiring board 101.

Here, in the present embodiment, an anisotropic conductive film (hereinafter referred to as an anisotropic conductive film (ACF)) is attached to the anode electrode 101c and the cathode electrode 101d or an anisotropic conductive paste (hereinafter referred to as an anisotropic conductive paste (ACP)) is applied, and the wiring board 101 is then attached to the glass substrate 110 and thermocompression-bonded. Accordingly, the anode electrode 101c and the anode terminal electrode 111, and the cathode electrode 101d and the cathode terminal electrode 112 are electrically connected.

As shown in FIG. 5 and FIG. 7, the anode wiring 101a and the anode electrode 101c are connected by an anode connection wiring 101e via a through-hole. In addition, as shown in FIG. 5 and FIG. 8, the cathode wiring 101b and the cathode electrode 101*d* are connected by a cathode connection wiring 101*f* via a through-hole. Therefore, a circuit is formed by the wiring board 101 without short circuiting a positive current and a negative current.

Here, in the present embodiment, the four anode terminal electrodes 111 and the four cathode terminal electrodes 112 are included in order to uniformly supply a current to the organic EL elements 10 and 20 formed in a rectangular shape and thus the four anode electrodes 101*c* and the four cathode electrodes 101*d* are formed on the wiring board 101. However, for example, when the three anode terminal electrodes 111 and the three cathode terminal electrodes 112 are included in order to uniformly supply a current to the organic EL elements 10 and 20 formed in a triangle shape, the three anode electrodes 101*c* and the three cathode electrodes 101*d* may be formed on the wiring board 101.

Further, when the five anode terminal electrodes 111 and the five cathode terminal electrodes 112 are included in order to uniformly supply a current to the organic EL elements 10 and 20 formed in a polygonal shape with five or more sides, the five or more anode electrodes 101*c* and the five or more cathode electrodes 101*d* may be formed on the wiring board 101.

Figure 9:
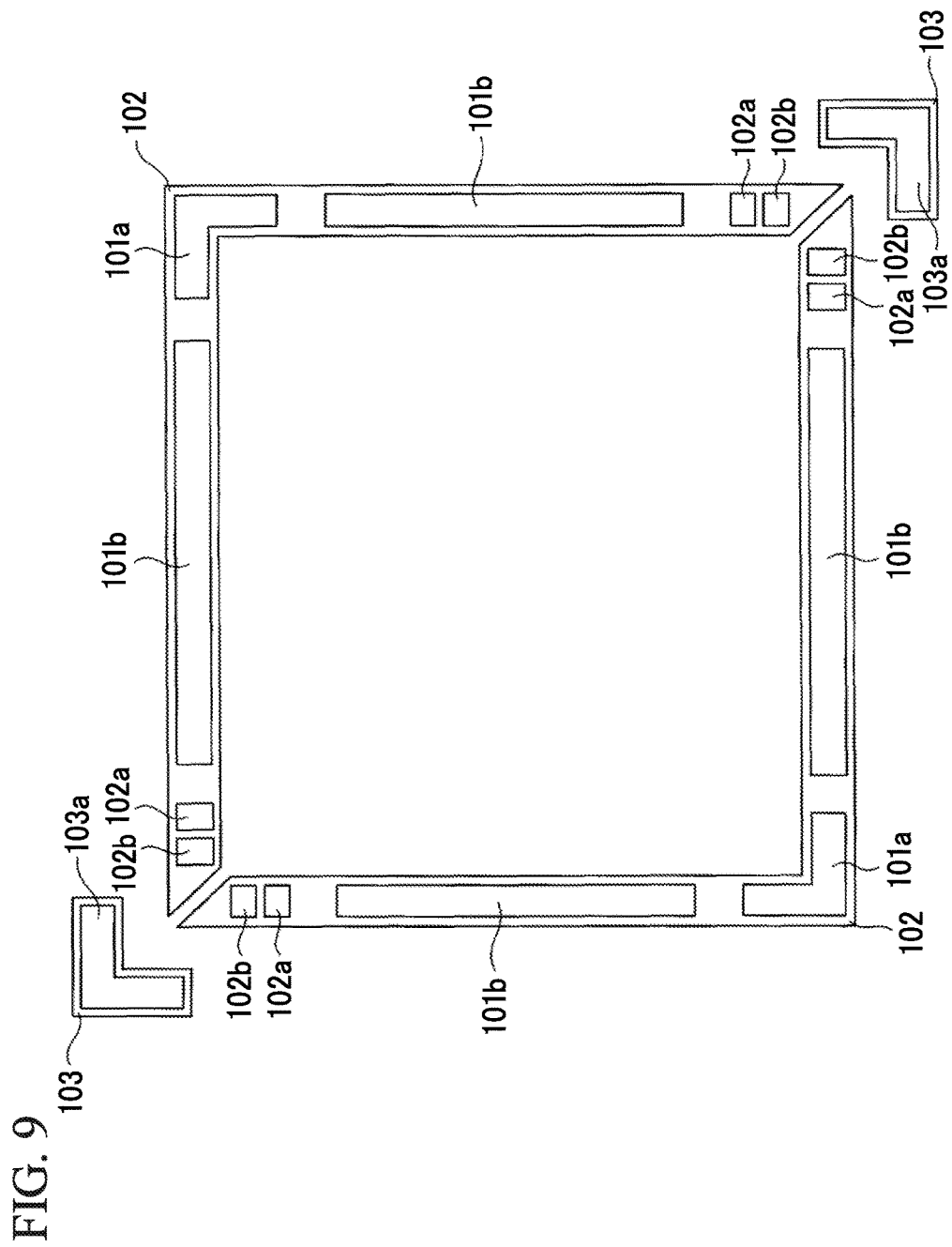
FIG. 9 is a schematic diagram of a configuration of a wiring board in the lighting device shown in FIG. 5.

FIG. 9 is a schematic diagram of a configuration of the wiring board 101 in the lighting device 100.

As shown in FIG. 9, the wiring board 101 includes two L-shaped wiring boards 102 having an L-shape and two L-shaped wiring boards for connection 103 having an L-shape for connecting the two L-shaped wiring boards 102 having an L-shape. An anode electrode 102*a* and a cathode electrode 102*b* are formed at ends of the surface of the L-shaped wiring board 102.

As shown in FIG. 7, the anode electrode 101*c* and the anode electrode 102*a* are connected by an anode connection wiring 102*c* via a through-hole. As shown in FIG. 8, the cathode electrode 101*d* and the cathode electrode 102*b* are connected by a cathode connection wiring 102*d* via a through-hole.

Here, in the present embodiment, the wiring board 101 is formed in a rectangular shape with a combination of the two L-shaped wiring boards 102 and the two L-shaped wiring boards for connection 103. However, the wiring board 101 is not limited thereto, and a wiring board that is formed in a rectangular shape may be used from the start. In addition, the wiring board 101 is not limited to the rectangular shape, and may have a U-shape or a V-shape, and as necessary, may be formed to surround a part or the whole of the organic EL elements 10 and 20.

FIG. 10A and FIG. 10B are schematic diagrams of a structure of the L-shaped wiring board for connection 103 in the lighting device 100. Here, FIG. 10A is a schematic diagram of a structure on a front side of the L-shaped wiring board for connection 103. FIG. 10B is a schematic diagram of a structure on a back side of the L-shaped wiring board for connection 103.

As shown in FIG. 10A, an anode wiring 103*a* is formed on the front side of the L-shaped wiring board for connection 103. In addition, as shown in FIG. 10B, on the back side of the L-shaped wiring board for connection 103, a cathode wiring electrode 103*b* and an anode electrode 103*c* are formed. As shown in FIG. 7, the anode wiring 103*a* and the anode electrode 103*c* are connected by an anode connection wiring 103*d* via a through-hole.

As shown in FIG. 5, FIG. 7 and FIG. 8, in the lighting device 100, the anode electrode 102*a* and the anode electrode 103*c*, and the cathode electrode 102*b* and the cathode wiring electrode 103*b* are connected by soldering.

Here, in the present embodiment, the anode electrode 102*a* and the anode electrode 103*c* are connected by soldering, and the cathode electrode 102*b* and the cathode wiring electrode 103*b* are connected by soldering, but these may be connected by thermocompression bonding using ACF or ACP.

In addition, in FIG. 5 to FIG. 10A and FIG. 10B, the anode wiring 101*a*, the cathode wiring 101*b* and the anode wiring 103*a* which are exposed to the outside are shown for simplicity. However, in order to avoid short circuiting or an electric shock, these are preferably covered with a non-electrically conductive material as necessary.

In addition, in the lighting device 100, although not shown in the drawing, a configuration in which an optical film for enhancing a color rendering property is provided on a light extraction surface side of the organic EL elements 10 and 20 can be provided.

It is generally known that the organic EL element emits light inside a light emitting layer having a higher refractive index (a refractive index of about 1.6 to 2.1) than air, and only about 15 to 20% of light emitted from the light emitting layer is extracted. This is because light incident on an interface at an angle equal to or greater than a critical angle is totally reflected and the light cannot be extracted to the outside of the element, or light is totally reflected between a transparent electrode or a light emitting layer and a transparent substrate, and the light is guided through the transparent electrode or the light emitting layer, and as a result, the light escapes in the direction of the side surface of the element.

Methods of increasing light extraction efficiency include, for example, a method in which an irregularity is formed on a surface of a transparent substrate and total reflection at the interface between the transparent substrate and air is prevented (for example, refer to "U.S. Pat. No. 4,774,435"), a method of increasing efficiency by imparting a light harvesting property to a substrate (for example, refer to "Japanese Unexamined Patent Application, First Publication No. S63-314795"), a method of forming a reflective surface on a side surface and the like of an element (for example, refer to "Japanese Unexamined Patent Application, First Publication No. H1-220394"), a method of introducing a flat layer having an intermediate refractive index between a substrate and a light emitting body and forming an anti-reflection film (for example, refer to "Japanese Unexamined Patent Application, First Publication No. S62-172691"), a method of introducing a flat layer having a lower refractive index than a substrate between the substrate and a light emitting body (for example, refer to "Japanese Unexamined Patent Application, First Publication No. 2001-202827"), and a method of forming a diffraction grating between a substrate and a layer of any of a transparent electrode layer and a light emitting layer (including between the substrate and the outside) (for example, refer to "Japanese Unexamined Patent Application, First Publication No. H11-283751").

Here, in the lighting device 100, in order to enhance the above color rendering property, a structure in which a microlens array or the like is additionally provided on a surface of the above optical film is used, a condensing sheet is combined, and light is collected in a specific direction, for example, in the front direction with respect to an element light emitting surface, and thus it is possible to increase luminance in the specific direction. Further, in order to control an angle at which light is emitted from the organic EL element, a light diffusion film may be used together with a condensing sheet. As such a light diffusion film, for example, a light diffusion film (Light-Up) commercially available from KIMOTO can be used.

Here, the present invention is not necessarily limited to the above embodiment, and various modifications can be made without departing from the scope and spirit of the present invention.

Specifically, in the present invention, the organic EL elements 10 and 20 by which the above white light is obtained can be suitably used as a light source of the lighting device 100, for example, a general lighting device. On the other hand, the present invention is not limited to a case in which the organic EL elements 10 and 20 are used as a light source of the lighting device 100, but the present invention can be used for various applications, such as, for example, a backlight of a liquid crystal display.

EXAMPLES

The effects of the present invention will be more clearly understood below with reference to the examples. Here, the present invention is not limited to the following examples, but can be appropriately changed and performed within ranges not changing the scope and spirit of the invention.

First Example

In the first example, an organic EL element having an element structure shown in FIG. 11 was produced. Specifically, first, a soda-lime glass substrate with a thickness of 0.7 mm on which an ITO film with a thickness of 100 nm, a width of 2 mm, and a sheet resistance of about 20Ω/□ was formed was prepared. Then, the substrate was subjected to ultrasonic cleaning using a mild detergent, deionized water, acetone, and isopropyl alcohol each for 5 minutes, and then spin-dried and additionally treated with UV/O$_3$.

Next, deposition crucibles (made of tantalum or alumina) in a vacuum deposition apparatus were filled with a constituent material of each layer shown in FIG. 11. Then, the above substrate was set in a vacuum deposition apparatus, and a current was applied to the deposition crucibles under a reduced pressure atmosphere with a degree of vacuum of $1 \times 10^{-4}$ Pa or less, and heating was performed. The layers were deposited to a predetermined film thickness at a deposition rate of 0.1 nm/s. In addition, a current was applied to the deposition crucibles and co-deposition was performed so that a layer made of two or more materials such as a light emitting layer was formed at a predetermined mixing ratio. In addition, the cathode was deposited onto a predetermined film thickness at a deposition rate of 1 nm/s.

In the first example, organic EL elements including one light emitting unit (light emitting layer) in which the thickness X[nm] of an electron transporting layer (ETL) was set to 55 nm, 92 nm, 142 nm, and 217 nm was produced. Then, a power supply (KEITHLEY 2425) was connected to the produced organic EL elements, a constant current of 3 mA/cm$^2$ was applied, and thus the organic EL elements were caused to emit light.

Figures 12, 13:
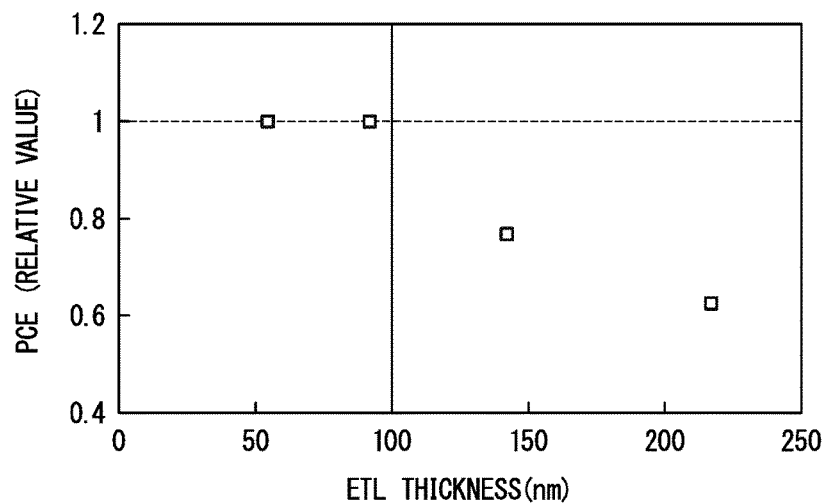
FIG. 12 is a graph showing the relationship between the thickness of an electron transporting layer (ETL) and PCE.
FIG. 13 is a cross-sectional view of an element structure of an organic EL element of a second example.

A driving voltage of the organic EL elements at that time was measured, and EQE and PCE were evaluated. The evaluation results are shown in the following Table 3. In addition, FIG. 12 shows a graph showing the relationship between the thickness X of the electron transporting layer (ETL) and PCE.

TABLE 3

| | ETL THICKNESS(nm) | | | |
|---|---|---|---|---|
| | 55 | 92 | 142 | 217 |
| DRIVING VOLTAGE (RELATIVE VALUE) | 1.00 | 1.11 | 1.24 | 1.88 |
| EQE (RELATIVE VALUE) | 1.00 | 1.11 | 0.96 | 1.18 |
| PCE (RELATIVE VALUE) | 1.00 | 1.00 | 0.77 | 0.63 |

Here, in Table 3, the driving voltage, the EQE value, and the PCE value when the thickness X of the electron transporting layer was 55 nm were set to a reference value (=1) and the driving voltage, the EQE value, and the PCE value at other thicknesses X were represented as relative values with respect to the reference value.

As shown in Table 3 and FIG. 12, it was confirmed that the value of PCE decreased from when the thickness X of the electron transporting layer exceeded 100 nm.

Second Example

In the second example, an organic EL element having an element structure shown in FIG. 13 was produced. Specifically, first, a soda-lime glass substrate with a thickness of 0.7 mm on which an ITO film with a thickness of 100 nm, a width of 2 mm, and a sheet resistance of about 20Ω/□ was formed was prepared. Then, the substrate was subjected to ultrasonic cleaning using a mild detergent, deionized water, acetone, and isopropyl alcohol each for 5 minutes, and then spin-dried, and additionally treated with UV/O$_3$.

Next, deposition crucibles (made of tantalum or alumina) in a vacuum deposition apparatus were filled with a constituent material of each layer shown in FIG. 13. Then, the above substrate was set in a vacuum deposition apparatus, and a current was applied to the deposition crucibles under a reduced pressure atmosphere with a degree of vacuum of $1 \times 10^{-4}$ Pa or less, and heating was performed. The layers were deposited to a predetermined film thickness at a deposition rate of 0.1 nm/s. In addition, a current was applied to the deposition crucibles and co-deposition was performed so that a layer made of two or more materials such as a light emitting layer was formed at a predetermined mixing ratio. In addition, the cathode was deposited to a predetermined film thickness at a deposition rate of 1 nm/s.

An organic EL element in which the light emitting layer 1 constituting the first light emitting unit was a red phosphorescent light emitting layer, the light emitting layer 2 constituting the second light emitting layer was a blue fluorescent light emitting layer, and the light emitting layer 3 constituting a third light emitting unit was a green phosphorescent light emitting layer was obtained.

In the second example, organic EL elements including three light emitting units (the light emitting layers 1 to 3) in which the thickness X[nm] of the electron transporting layer (ETL) positioned closest to the side of the cathode was 28 nm, 38 nm, 48 nm, 58 nm, and 68 nm were produced. Then, a power supply (KEITHLEY 2425) was connected to the produced organic EL elements, a constant current of 3 mA/cm$^2$ was applied, and thus the organic EL elements were caused to emit light. Driving voltages of the organic EL elements at that time were measured, and EQE and PCE were evaluated.

Figure 14:
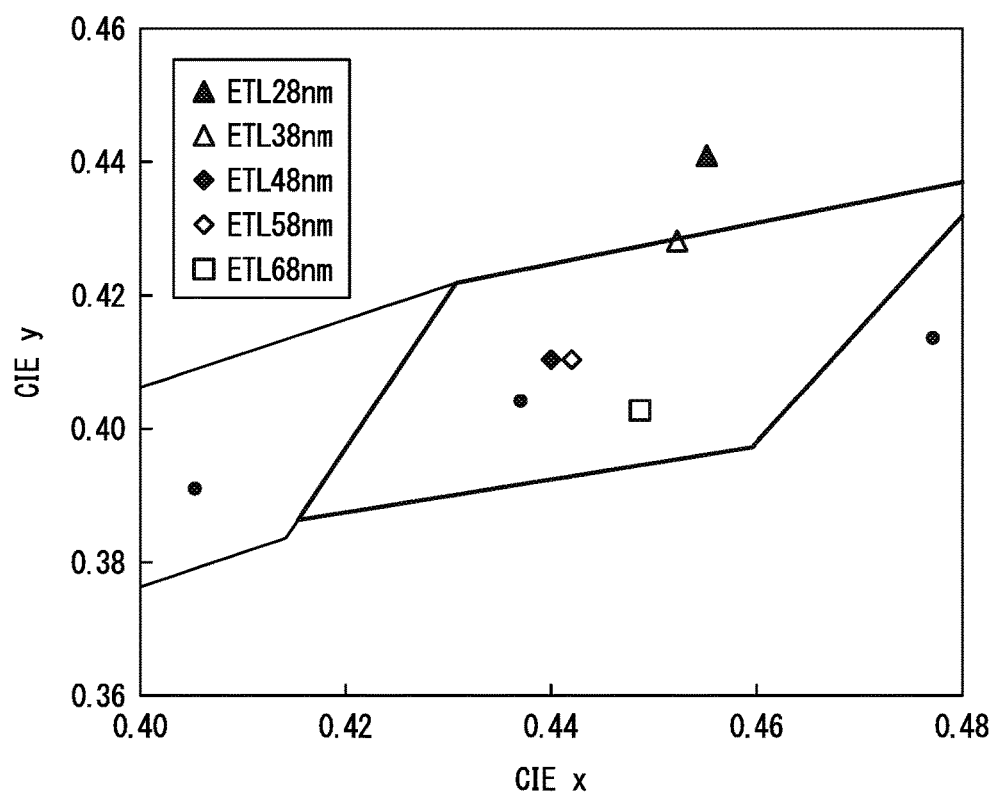
FIG. 14 is a color coordinate graph showing evaluation results of the organic EL element of the second example.

In addition, the color rendering property (CRI) and the color temperature (CCT) were evaluated. Specifically, based on the measurement results of the second example, luminescent colors were evaluated on chromaticity coordinates of a CIE color system. In addition, based on the chromaticity coordinates, the luminescent colors were classified into light source colors defined in "JIS Z 9112." In addition, a deviation duv from the blackbody locus was derived based on the definition in "JIS Z 8725." Further, an average color rendering index (Ra) of the luminescent color was derived according to a method defined in "JIS Z 8726." The evaluation results are shown in the following Table 4 and FIG. 14. Here, black dots shown in FIG. 14 represent trajectories of blackbody radiation.

TABLE 4

| | ETL THICKNESS(nm) | | | | |
|---|---|---|---|---|---|
| | 28 | 38 | 48 | 58 | 68 |
| DRIVING VOLTAGE (RELATIVE VALUE) | 1.00 | 1.01 | 1.03 | 1.04 | 1.05 |
| EQE (RELATIVE VALUE) | 1.00 | 1.09 | 1.20 | 1.16 | 1.16 |
| PCE (RELATIVE VALUE) | 1.00 | 1.08 | 1.16 | 1.12 | 1.10 |
| CRI (Ra) | 75 | 75 | 79 | 80 | 84 |
| CCT (K) | 2,990 | 2,940 | 2,990 | 2,970 | 2,810 |
| duv | 0.011 | 0.007 | 0.002 | 0.002 | −0.002 |

Here, in Table 4, the driving voltage, the EQE value, and the PCE value when the thickness X of the electron transporting layer was 28 nm were set to a reference value (=1), and the driving voltage, the EQE value, and the PCE value at other thicknesses X were represented as relative values with respect to the reference value.

As shown in Table 4, it was confirmed that the driving voltage increased as the thickness X of the electron transporting layer increased, but an increment of EQE was greater with respect to an increase in the driving voltage. As a result, it was confirmed that PCE also increased. In addition, it was confirmed that an average color rendering index (Ra) of 70 or more was also maintained. In addition, as shown in FIG. 14, it was confirmed that, when the thickness X of the electron transporting layer was thin at 28 nm, chromaticity coordinates were outside ranges defined in JIS Z 9112.

In addition, when the thickness X of the electron transporting layer (ETL) positioned closest to the side of the cathode was 38 nm, 48 nm, 58 nm, and 68 nm, the total thickness of the first light emitting unit was 126.6 nm, 136.6 nm, 146.6 nm, and 156.6 nm, and a difference between the total thickness (93.6 nm) of the second light emitting unit and the total thickness of the first light emitting unit was 33 nm to 63 nm. In addition, the difference between the total thickness (93.6 nm) of the second light emitting unit and the total thickness (140 nm) of the third light emitting unit was 46.4 nm. Accordingly, these organic EL elements had an excellent effect of preventing short circuiting and had an excellent effect of light emission efficiency.

Third Example

In the third example, an organic EL element having an element structure shown in FIG. 15 was produced. Specifically, first, a soda-lime glass substrate with a thickness of 0.7 mm on which an ITO film with a thickness 100 nm, a width of 2 mm, and a sheet resistance of about 20Ω/□ was formed was prepared. Then, the substrate was subjected to ultrasonic cleaning using a mild detergent, deionized water, acetone, and isopropyl alcohol each for 5 minutes, and then spin-dried and additionally treated with UV/$O_3$.

Next, deposition crucibles (made of tantalum or alumina) in a vacuum deposition apparatus were filled with a constituent material of each layer shown in FIG. 15. Then, the above substrate was set in a vacuum deposition apparatus, and a current was applied to the deposition crucibles under a reduced pressure atmosphere with a degree of vacuum of $1 \times 10^{-4}$ Pa or less, and heating was performed. The layers were deposited to a predetermined film thickness at a deposition rate of 0.1 nm/s. In addition, a current was applied to the deposition crucibles and co-deposition was performed so that a layer made of two or more materials such as a light emitting layer was formed at a predetermined mixing ratio. In addition, the cathode was deposited to a predetermined film thickness at a deposition rate of 1 nm/s.

An organic EL element in which the light emitting layer 1 constituting the first light emitting unit was a red phosphorescent light emitting layer, the light emitting layer 2 constituting the second light emitting layer was a blue fluorescent light emitting layer, and the light emitting layer 3 constituting a third light emitting unit was a green phosphorescent light emitting layer was obtained.

In the third example, an organic EL element including three light emitting units (the light emitting layers 1 to 3) in which the electron transporting layer (ETL) constituting the first light emitting unit was set to the thickness $T_1$ [nm], the electron transporting layer (ETL) constituting the second light emitting unit was set to the thickness $T_2$ [nm], and the electron transporting layer (ETL) constituting the third light emitting unit was set to the thickness $T_3$ [nm] was produced.

Specifically, the organic EL elements of Example 1 ($T_1$=48, $T_2$=15, $T_3$=5), Comparative Example 1 ($T_1$=28, $T_2$=30, $T_3$=30), Comparative Example 2 ($T_1$=48, $T_2$=50, $T_3$=50), and Comparative Example 3 ($T_1$=28, $T_2$=15, $T_3$=5) in which the thicknesses $T_1$, $T_2$, and $T_3$ of the electron transporting layers were changed were produced.

Then, a power supply (KEITHLEY 2425) was connected to the organic EL elements of Example 1 and Comparative Examples 1 to 3, a constant current of 3 mA/cm$^2$ was applied, and thus the organic EL elements were caused to emit light. A driving voltage of the organic EL elements at that time was measured, and EQE and PCE were evaluated.

Figure 16:
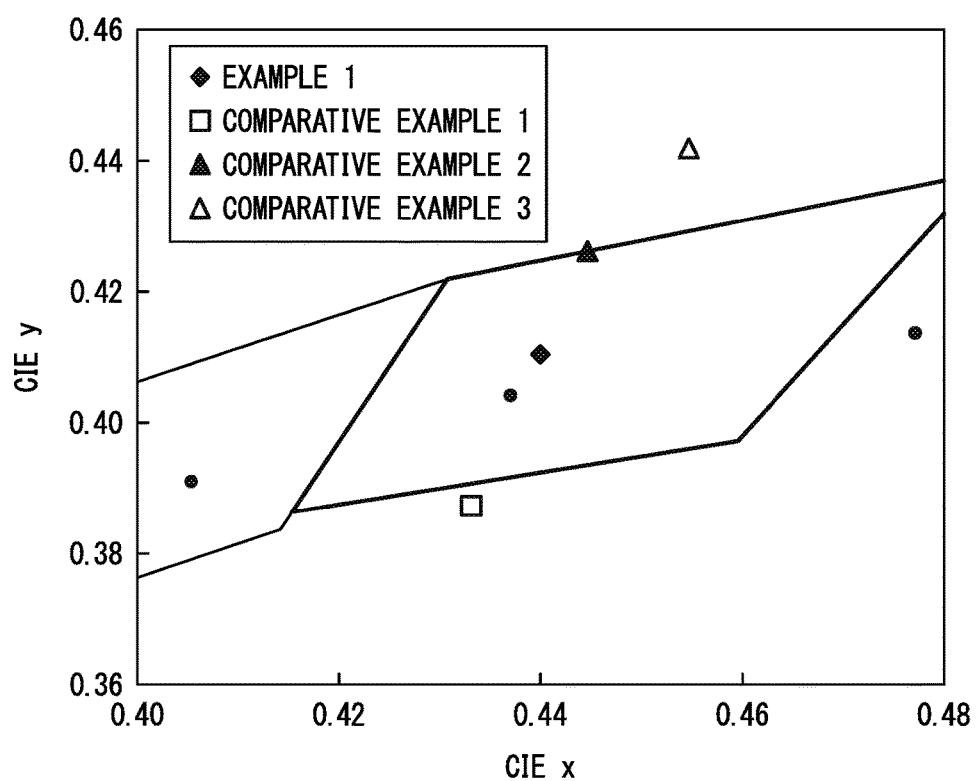
FIG. 16 is a color coordinate graph showing evaluation results of the organic EL element of the third example.

In addition, the color rendering property (CRI) and the color temperature (CCT) were evaluated. Specifically, based on the measurement results of the third example, luminescent colors were evaluated on chromaticity coordinates of a CIE color system. In addition, based on the chromaticity coordinates, the luminescent colors were classified into light source colors defined in "JIS Z 9112." In addition, a deviation duv from the blackbody locus was derived based on the definition in "JIS Z 8725." Further, an average color rendering index (Ra) of the luminescent color was derived according to a method defined in "JIS Z 8726." The evaluation results are shown in the following Table 5 and FIG. 16. Here, black dots shown in FIG. 16 represent trajectories of blackbody radiation.

TABLE 5

|  | EXAMPLE 3 | COMPARATIVE EXAMPLE 1 | COMPARATIVE EXAMPLE 2 | COMPARATIVE EXAMPLE 3 |
| --- | --- | --- | --- | --- |
| THICKNESS $T_1$ (nm) | 48 | 28 | 48 | 28 |
| THICKNESS $T_2$ (nm) | 15 | 30 | 50 | 15 |
| THICKNESS $T_3$ (nm) | 5 | 30 | 50 | 5 |
| DRIVING VOLTAGE (RELATIVE VALUE) | 1.00 | 1.00 | 1.06 | 0.97 |
| EQE (RELATIVE VALUE) | 1.00 | 0.85 | 0.92 | 0.83 |
| PCE (RELATIVE VALUE) | 1.00 | 0.86 | 0.87 | 0.86 |
| CRI (Ra) | 79 | 84 | 83 | 74 |
| CCT (K) | 2,990 | 2,920 | 3,040 | 2,990 |
| duv | 0.002 | −0.006 | 0.007 | 0.011 |

Here, in Table 5, the driving voltage, the EQE value, and the PCE value of Example 1 were set to a reference value (=1), and the driving voltage, the EQE value and the PCE value of Comparative Examples 1 to 3 were represented as relative values with respect to the reference value.

In Example 1 ($T_1$=48, $T_2$=15, $T_3$=5), the total thickness of the first light emitting unit was 136.6 nm, and a difference between the total thickness (93.6 nm) of the second light emitting unit and the total thickness of the first light emitting unit was 43 nm. In addition, a difference between the total thickness (93.6 nm) of the second light emitting unit and the total thickness (140 nm) of the third light emitting unit was 46.4 nm. Accordingly, these organic EL elements had an excellent effect of preventing short circuiting and had an excellent effect of light emission efficiency.

In addition, in the organic EL elements of Example 1 and Comparative Examples 1 to 3, determinations of whether the thicknesses $T_1$, $T_2$, and $T_3$ of the electron transporting layers did (O) or did not (X) satisfy conditions of the present invention are summarized in the following Table 6.

TABLE 6

|  | $30 \le T_1 \le 100$ (nm) | $T_2, T_3 < T_1$, $T_2, T_3 \le 20$ (nm) |
| --- | --- | --- |
| EXAMPLE 3 | o | o |
| COMPARATIVE EXAMPLE 1 | x | x |
| COMPARATIVE EXAMPLE 2 | o | x |
| COMPARATIVE EXAMPLE 3 | x | o |

As shown in Table 6 and FIG. 16, it was confirmed that the organic EL element of Example 1 that satisfied conditions of the present invention had a more favorable EQE value and PCE value than the organic EL elements of Comparative Examples 1 to 3. In addition, in the organic EL element of Example 1, a favorable color rendering property and color temperature were obtained as a result. On the other hand, some of the organic EL elements of Comparative Examples 1 to 3 were outside the chromaticity range defined in "JIS Z 9112."

INDUSTRIAL APPLICABILITY

The present invention can be applied to an organic electroluminescent element and a lighting device in which light emission with high luminance and high efficiency and a long light emission lifespan are necessary.

REFERENCE SIGNS LIST

10 Organic EL element (first embodiment)
11 Cathode
12 Anode
13 First light emitting unit
14 Second light emitting unit
15 First charge generating layer
16A First functional layer
17A First light emitting layer
18A Second functional layer
16B Third functional layer
17B Second light emitting layer
18B Fourth functional layer
20 Organic EL element (second embodiment)
21 Cathode
22 Anode
23 First light emitting unit
24 Second light emitting unit
25 Third light emitting unit
26A First charge generating layer
26B Second charge generating layer
27A First functional layer
28A First light emitting layer
29A Second functional layer
27B Third functional layer
28B Second light emitting layer
29B Fourth functional layer
27C Fifth functional layer
28C Third light emitting layer
29C Sixth functional layer
100 Lighting device (third embodiment)
101a Anode wiring
101b Cathode wiring
101c Anode electrode
101d Cathode electrode
101e Anode connection wiring
101f Cathode connection wiring
102 L-shaped wiring board
102a Anode electrode
102b Cathode electrode
102c Anode connection wiring
102d Cathode connection wiring
103 L-shaped wiring board for connection 103a Anode wiring
103b Cathode wiring electrode
103c Anode electrode
103d Anode connection wiring
110 Glass substrate
111 Anode terminal electrode
112 Cathode terminal electrode
114 Sealing material

The invention claimed is:

1. An organic electroluminescent element which has a structure in which a plurality of light emitting units including at least a light emitting layer made of an organic compound are laminated between a cathode and an anode with a charge generating layer between the light emitting units and in which white light is obtained when the plurality of light emitting units emit light, the organic electroluminescent element comprising:
a first light emitting unit that is positioned closest to the side of the cathode among the plurality of light emitting units;
a second light emitting unit that is adjacent to the first light emitting unit with sandwiching a first charge generating layer; and
a third light emitting unit that is adjacent to the second light emitting unit with sandwiching a second charge generating layer,
wherein the first light emitting unit includes a first light emitting layer, a first functional layer including an electron transporting layer between the first light emitting layer and the cathode, and a second functional layer including a hole transporting layer between the first light emitting layer and the first charge generating layer,
wherein the second light emitting unit includes a second light emitting layer, a third functional layer including an electron transporting layer between the second light emitting layer and the first charge generating layer, and a fourth functional layer including a hole transporting layer between the second light emitting layer and the second charge generating layer,
wherein the third light emitting unit includes a third light emitting layer, a fifth functional layer including an electron transporting layer between the third light emitting layer and the second charge generating layer, and a sixth functional layer including a hole transporting layer between the third light emitting layer and the anode,
wherein the thickness of the third functional layer and the thickness of the fifth functional layer are smaller than the thickness of the first functional layer,
wherein the first light emitting unit and the third light emitting unit include a phosphorescent light emitting layer capable of emitting light from triplet excitons,
wherein the second light emitting unit includes a blue fluorescent light emitting layer capable of emitting light from singlet excitons, and
wherein differences of the total thickness of the first light emitting unit and the total thickness of the third light emitting unit with the total thickness of the second light emitting unit are 30 nm to 70 nm.

2. The organic electroluminescent element according to claim 1,
wherein the first light emitting layer is a red phosphorescent light emitting layer that emits red light having a peak wavelength in a red wavelength range,
wherein the second light emitting layer is a blue fluorescent light emitting layer that emits blue light having a peak wavelength in a blue wavelength range, and
wherein the third light emitting layer is a green phosphorescent light emitting layer that emits green light having a peak wavelength in a green wavelength range.

3. The organic electroluminescent element according to claim 1,
wherein the thickness of the first functional layer is 30 nm to 70 nm.

4. The organic electroluminescent element according to claim 1,
wherein the thickness of the third functional layer and the thickness of the fifth functional layer are 1 nm to 20 nm.

5. The organic electroluminescent element according to claim 1,
wherein light emitted from the light emitting unit including the blue fluorescent light emitting layer includes a delayed fluorescent component.

6. The organic electroluminescent element according to claim 1,
wherein the total thickness of the second light emitting unit is smaller than both the total thickness of the first light emitting unit and the total thickness of the third light emitting unit.

7. The organic electroluminescent element according to claim 1,
wherein the charge generating layer is an electrically insulating layer made of an electron accepting substance and an electron donating substance, and the resistivity of the electrically insulating layer is $1.0 \times 10^2$ Ω·cm or more.

8. The organic electroluminescent element according to claim 7,
wherein the resistivity of the electrically insulating layer is $1.0 \times 10^5$ Ω·cm or more.

9. The organic electroluminescent element according to claim 1,
wherein the charge generating layer is a layer in which different substances are mixed, one component of the substances is a metal oxide, and the metal oxide forms a charge transfer complex due to a redox reaction, and
wherein, when a voltage is applied between the cathode and the anode, charges in the charge transfer complex move toward the cathode and the anode, holes are injected into one light emitting unit positioned on the side of the cathode with sandwiching the charge generating layer, and electrons are injected into the other light emitting unit positioned on the side of the anode with sandwiching the charge generating layer.

10. The organic electroluminescent element according to claim 1,
wherein the charge generating layer is made of a laminate of an electron accepting substance and an electron donating substance, and
wherein, when a voltage is applied between the cathode and the anode, charges generated due to a reaction according to electron movement between the electron accepting substance and the electron donating substance move toward the cathode and the anode at the interface between the electron accepting substance and the electron donating substance, and thus holes are injected into one light emitting unit positioned on the side of the cathode with sandwiching the charge generating layer, and electrons are injected into the other light emitting unit positioned on the side of the anode with sandwiching the charge generating layer.

11. The organic electroluminescent element according to claim 1,
wherein the charge generating layer is formed of a laminate or a mixture of a material according to the following Structural Formula (1) and another organic material

[Chem. 1]

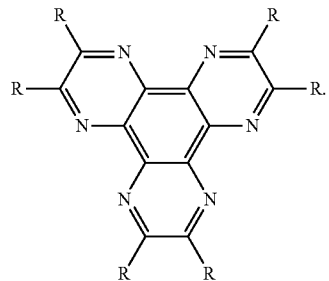
(1)

R = REPRESENTS AN ELECTRON WITHDRAWING GROUP OF F, Cl, Br, I, CN, and CF$_3$

12. The organic electroluminescent element according to claim 1, wherein a luminescent color of the white light is classified into a light bulb color (L) or a warm white color (WW) in a chromaticity range and an average color rendering index (Ra) of the white light is 70 or more.

13. A lighting device comprising the organic electroluminescent element according to claim 1.

14. The organic electroluminescent element according to claim 2,
wherein the thickness of the first functional layer is 30 nm to 70 nm.

15. The organic electroluminescent element according to claim 2,
wherein the thickness of the third functional layer and the thickness of the fifth functional layer are 1 nm to 20 nm.

16. The organic electroluminescent element according to claim 2,
wherein light emitted from the light emitting unit including the blue fluorescent light emitting layer includes a delayed fluorescent component.

17. The organic electroluminescent element according to claim 2,
wherein the charge generating layer is an electrically insulating layer made of an electron accepting substance and an electron donating substance, and the resistivity of the electrically insulating layer is $1.0 \times 10^2$ $\Omega \cdot cm$ or more.

18. The organic electroluminescent element according to claim 2,
wherein the charge generating layer is a layer in which different substances are mixed, one component of the substances is a metal oxide, and the metal oxide forms a charge transfer complex due to a redox reaction, and
wherein, when a voltage is applied between the cathode and the anode, charges in the charge transfer complex move toward the cathode and the anode, holes are injected into one light emitting unit positioned on the side of the cathode with sandwiching the charge generating layer, and electrons are injected into the other light emitting unit positioned on the side of the anode with sandwiching the charge generating layer.

19. The organic electroluminescent element according to claim 2,
wherein the charge generating layer is made of a laminate of an electron accepting substance and an electron donating substance, and
wherein, when a voltage is applied between the cathode and the anode, charges generated due to a reaction according to electron movement between the electron accepting substance and the electron donating substance move toward the cathode and the anode at the interface between the electron accepting substance and the electron donating substance, and thus holes are injected into one light emitting unit positioned on the side of the cathode with sandwiching the charge generating layer, and electrons are injected into the other light emitting unit positioned on the side of the anode with sandwiching the charge generating layer.

20. A lighting device comprising the organic electroluminescent element according to claim 2.

* * * * *